(12) United States Patent
Erbil et al.

(10) Patent No.: US 9,780,278 B2
(45) Date of Patent: *Oct. 3, 2017

(54) METHOD AND APPARATUS FOR GENERATING ELECTRICITY BY THERMALLY CYCLING AN ELECTRICALLY POLARIZABLE MATERIAL USING HEAT FROM CONDENSERS

(71) Applicant: The Neothermal Energy Company, Atlanta, GA (US)

(72) Inventors: Ahmet Erbil, Atlanta, GA (US); David F. Walbert, Atlanta, GA (US)

(73) Assignee: THE NEOTHERMAL ENGERGY COMPANY, Atlanta, GA (US)

(*) Notice: Subject to any disclaimer, the term of this patent is extended or adjusted under 35 U.S.C. 154(b) by 183 days.

This patent is subject to a terminal disclaimer.

(21) Appl. No.: 14/572,903

(22) Filed: Dec. 17, 2014

(65) Prior Publication Data

US 2015/0144172 A1    May 28, 2015

Related U.S. Application Data

(63) Continuation of application No. 13/272,791, filed on Oct. 13, 2011, now Pat. No. 8,946,538, and a
(Continued)

(51) Int. Cl.
*H01L 35/30* (2006.01)
*H01L 35/32* (2006.01)
(Continued)

(52) U.S. Cl.
CPC ............ *H01L 35/30* (2013.01); *H01L 35/325* (2013.01); *H01L 37/02* (2013.01); *F28B 1/00* (2013.01); *F28D 7/16* (2013.01); *F28D 7/1607* (2013.01)

(58) Field of Classification Search
CPC .................................. H01L 35/30; H01L 37/02
See application file for complete search history.

(56) References Cited

U.S. PATENT DOCUMENTS 2,392,638 A * 1/1946 Bowman .................. F28B 1/02
165/111
3,073,974 A * 1/1963 Hoh ......................... H01G 7/02
307/149
(Continued)

FOREIGN PATENT DOCUMENTS

EP    1145333 A1    10/2001
FR    2532489 A1    3/1984
(Continued)

OTHER PUBLICATIONS

R.B. Olsen, et al., Cascaded Pyroelectric Energy Converter, Ferroelectrics, 1984, vol. 59, pp. 205-219, Gordon and Breach, Science Publishers, Inc. US.
(Continued)

*Primary Examiner* — Judy Swann
*Assistant Examiner* — Christopher R Zerphey
(74) *Attorney, Agent, or Firm* — Tim Tingkang Xia, Esq.; Locke Lord LLP

(57) ABSTRACT

A method for converting heat to electric energy is described which involves thermally cycling an electrically polarizable material sandwiched between electrodes. The material is heated by extracting thermal energy from a gas to condense the gas into a liquid and transferring the thermal energy to the electrically polarizable material. An apparatus is also described which includes an electrically polarizable material sandwiched between electrodes and a heat exchanger for heating the material in thermal communication with a heat source, wherein the heat source is a condenser. An apparatus is also described which comprises a chamber, one or more conduits inside the chamber for conveying a cooling fluid
(Continued)

and an electrically polarizable material sandwiched between electrodes on an outer surface of the conduit. A gas introduced into the chamber condenses on the conduits and thermal energy is thereby transferred from the gas to the electrically polarizable material.

9 Claims, 25 Drawing Sheets

Related U.S. Application Data continuation-in-part of application No. 13/226,799, filed on Sep. 7, 2011, now Pat. No. 8,344,585, which is a continuation-in-part of application No. 12/465,924, filed on May 14, 2009, now Pat. No. 8,035,274, said application No. 13/272,791 is a continuation-in-part of application No. 13/228,051, filed on Sep. 8, 2011, now Pat. No. 8,350,444, which is a continuation-in-part of application No. 12/465,924, filed on May 14, 2009, now Pat. No. 8,035,274, said application No. 13/272,791 is a continuation-in-part of application No. 13/247,525, filed on Sep. 28, 2011, now Pat. No. 9,000,651, and a continuation-in-part of application No. 13/226,799, filed on Sep. 7, 2011, now Pat. No. 8,344,585, and a continuation-in-part of application No. 13/228,051, filed on Sep. 8, 2011, now Pat. No. 8,350,444.

(60) Provisional application No. 61/406,793, filed on Oct. 26, 2010, provisional application No. 61/387,752, filed on Sep. 29, 2010, provisional application No. 61/387,760, filed on Sep. 29, 2010, provisional application No. 61/390,453, filed on Oct. 6, 2010, provisional application No. 61/390,435, filed on Oct. 6, 2010, provisional application No. 61/392,781, filed on Oct. 13, 2010, provisional application No. 61/392,787, filed on Oct. 13, 2010, provisional application No. 61/392,801, filed on Oct. 13, 2010, provisional application No. 61/405,516, filed on Oct. 21, 2010, provisional application No. 61/405,918, filed on Oct. 22, 2010.

(51) Int. Cl.
*H01L 37/02* (2006.01)
*F28B 1/00* (2006.01)
*F28D 7/16* (2006.01)

(56) References Cited

U.S. PATENT DOCUMENTS

| | | | |
|---|---|---|---|
| 3,243,687 A * | 3/1966 | Hoh | H01G 7/02 136/213 |
| 3,255,401 A * | 6/1966 | Koln | H01L 37/02 310/311 |
| 3,554,515 A | 1/1971 | Tonooka et al. | |
| 3,824,448 A | 7/1974 | De Rivas | |
| 4,047,093 A * | 9/1977 | Levoy | F24J 3/085 165/104.26 |
| 4,074,660 A | 2/1978 | Tsao | |
| 4,099,019 A | 7/1978 | Horibe et al. | |
| 4,210,820 A | 7/1980 | Wittig | |
| 4,220,906 A | 9/1980 | Drummond | |
| 4,226,606 A | 10/1980 | Yaeger et al. | |
| 4,245,693 A | 1/1981 | Cheng | |
| 4,296,800 A | 10/1981 | Johnson | |
| 4,327,670 A | 5/1982 | Teller | |
| 4,372,937 A | 2/1983 | Johnson | |
| 4,425,540 A | 1/1984 | Olsen | |
| 4,589,890 A | 5/1986 | Gronvaldt | |
| 4,647,836 A | 3/1987 | Olsen | |
| 4,651,814 A | 3/1987 | Ito et al. | |
| 4,766,952 A | 8/1988 | Onodera | |
| 4,983,839 A | 1/1991 | Deb | |
| 5,555,838 A | 9/1996 | Bergman | |
| 5,625,245 A | 4/1997 | Bass | |
| 5,851,498 A | 12/1998 | Rozenshtein et al. | |
| 6,379,809 B1 | 4/2002 | Simpson et al. | |
| 6,431,856 B1 | 8/2002 | Maenishi et al. | |
| 6,495,749 B2 * | 12/2002 | Paramonov | F01K 27/00 136/205 |
| 6,528,898 B1 * | 3/2003 | Ikura | H01L 37/02 290/1 R |
| 6,742,337 B1 | 6/2004 | Hays et al. | |
| 7,043,912 B1 | 5/2006 | Radcliff et al. | |
| 7,323,506 B2 | 1/2008 | Kouchachvili et al. | |
| 7,328,578 B1 | 2/2008 | Saucedo | |
| 7,569,194 B2 | 8/2009 | Russell | |
| 7,593,250 B2 | 9/2009 | Naumov et al. | |
| 7,735,321 B2 | 6/2010 | Howard | |
| 7,768,050 B2 | 8/2010 | Rappe et al. | |
| 7,982,360 B2 * | 7/2011 | Erbil | H01L 37/02 136/254 |
| 8,344,585 B2 * | 1/2013 | Erbil | H01L 37/02 136/254 |
| 8,350,444 B2 * | 1/2013 | Erbil | H01L 37/02 136/254 |
| 8,946,538 B2 * | 2/2015 | Erbil | H01L 37/02 136/201 |
| 9,000,651 B2 * | 4/2015 | Erbil | H01L 37/02 136/254 |
| 2002/0129850 A1 * | 9/2002 | Nomura | H01L 31/0236 136/251 |
| 2003/0162394 A1 | 8/2003 | Takemura | |
| 2006/0122299 A1 | 6/2006 | Kouchachvili et al. | |
| 2008/0028769 A1 * | 2/2008 | Goenka | B60H 1/00328 62/3.7 |
| 2008/0074211 A1 | 3/2008 | Miles et al. | |
| 2008/0130346 A1 | 6/2008 | Naumov et al. | |
| 2008/0295879 A1 | 12/2008 | Atanackovic | |
| 2009/0010303 A1 | 1/2009 | Nagashima et al. | |
| 2010/0289377 A1 | 11/2010 | Erbil et al. | |
| 2011/0001390 A1 | 1/2011 | Erbil et al. | |

FOREIGN PATENT DOCUMENTS

| | | |
|---|---|---|
| GB | 1506587 A | 4/1978 |
| JP | 5512508 A | 1/1980 |
| JP | 6361125 A | 3/1988 |
| JP | 63233340 A | 9/1988 |
| KR | 1020070056373 A | 6/2007 |
| WO | 9313564 A1 | 7/1993 |
| WO | 9965051 A2 | 12/1999 |
| WO | 00/36656 | 6/2000 |
| WO | 0036656 A1 | 6/2000 |
| WO | 2005011376 A2 | 2/2005 |
| WO | 2006058417 A1 | 6/2006 |
| WO | 2007140061 A2 | 12/2007 |
| WO | 2008088994 A2 | 7/2008 |
| WO | 2010061385 A1 | 6/2010 |

OTHER PUBLICATIONS

D. Vanderpool, et al., Simulations of a Prototypical Device Using Pyroelectric Materials for Harvesting Waste Heat, Intl. J. of Heat & Mass Transfer, vol. 51, 2008, pp. 5052-5062, Elsevier Ltd., Los Angeles.

M.E. Lines, et al., "Principles and Applications of Ferroelectrics and Related Materials", App. F, 1977, pp. 620-633, Oxford University Press Inc., New York.

R.B. Olsen, et al., "Pyroelectric Energy Conversion: Hysteresis loss and temperature sensitivity of a ferroelectric material", J. Appl. Phys. 54, Oct. 1983, pp. 5941-5944.

L. Kouchachvili, et al., "Pyroelectric Conversion—Effects of P(VDF-TrFE) preconditioning on Power Conversion", Journal of Electrostatics 65, 2007, pp. 182-188, Elsevier B.V.

(56) References Cited

OTHER PUBLICATIONS

W.B. Tiffany, Coherent Inc.: The Amazing Versatile Pyroelectric, pp. 1-3.
U.S. DOE, A Technology Roadmap for Generation IV Nuclear Systems, Dec. 2002.
Study prepared for the U.S. Department of Energy by an MIT-lead interdisciplinary panel, The Future of Geothermal Energy: Impact of Enhanced Geothermal Systems (EGS) of the United States in the 21st Century, 2006, Massachusetts Institute of Technology.
V. Viswanathan, Opportunity Analysis for Recovering Energy From Industrial Waste Heat and Emissions, Pacific NW Nat'l Lab., Jun. 1, 2005, Chicago, IL.
Prepared for the U.S. DOE, Energy Use, Loss and Opportunities Analysis: U.S. Manufacturing and Mining, Dec. 2004, pp. 1-165.
A. Burke, Energy Storage in Advanced Vehicle Systems, Institute of Transportation Studies, Univ. of California, Davis, (presented at Stanford University, Oct. 10, 2005).
J. Yang, Thermolectric Technology for Automotive Waste Heat Recovery, General Motors R&D, presented at the Aug. 15, 2007 DEER Conference, sponsored by U.S. DOE, Detroit, MI.
J.A. Duffie, et al., Solar Engineering of Thermal Processes, John Wiley & Sons, Inc., 3rd Ed., 2006.
Babcock, et al., Steam: Its Generation and Use, Chs. 47-56, 40th Ed. 1992.
F.P. Incropera, et al., Fundamentals of heat and Mass Transfer, John Wiley & Sons, Inc., 6th Ed., 2006.
M.J. Moran, et al., Introduction to Thermal Systems Engineering: Thermodynamics, Fluid Mechanics, and Heat Transfer, John Wiley & Sons, Inc., 2003.
D.A. Kaminiski, et al., Introduction of Thermal and Fluids Engineering, John Wiley & Sons, Inc., 2005.
M.M. El-Wakil, Nuclear Energy Conversion, American Nuclear Society, 1992, pp. 1.
R.W. Serth, Process Heat Transfer: Principles and Applications, Elsevier, 2007.
R.E. Hayes, et al., Introduction to Catalytic Combustion, Gordon and Breach Science Publishers, 1997.
G.P. Peterson, An Introduction to Heat Pipes: Modeling, Testing and Applications, 1994.
Guyomar, Daniel et al., Energy Harvesting Based on FE-FE Transition in Ferroelectric Single Crystals, IEEE Transactions on Ultrasonics, Ferroelectrics, and Frequency Control, Feb. 2008, pp. 279-285,, vol. 55, No. 2.
Pan, Qing Yang et al., Ferroelectric Behavior in Poly-L-Lactic Acid, Jpn. J. Appl. Phys., Nov. 1996, pp. 1442-1445, vol. 35, Part 2, No. 11A.
Bauer, Siegfried, Pyroelectric Polymer Electrets, IEEE Transactions on Dielectrics and Electrical Insulation, Oct. 1996, pp. 647-676, vol. 3, No. 5.
European Patent Office, "EP Extended Search Report for EP Application No. 11836859.6", EP, Sep. 1, 2015.

\* cited by examiner

900

910 — Providing a ferroelectric layer formed of a ferroelectric material characterized with a Curie temperature, $T_C$, with a pair of electrodes on the first and second surface of the ferroelectric layer, respectively.

920 — Alternatively delivering a flow of cold and hot fluids so as to alternately cool the ferroelectric layer to a first temperature $T_L$ that is lower than the Curie temperature $T_C$, and heat the ferroelectric layer to a second temperature $T_H$; the ferroelectric material of the ferroelectric layer thereby undergoes alternating phase transitions between the ferroelectric phase and the paraelectric phase with temperature cycling. The electrical circuit is open during heating and cooling under constant polarizations, $P_H$ and $P_L$, respectively.

930 — Alternatively delivering a flow of cold and hot fluids to as to alternatively remove heat from the ferroelectric layer isothermally at $T_L$ and add heat to the ferroelectric layer isothermally at $T_H$. During these steps, the electrical circuit is closed so that the addition and withdrawal of heat occurs while polarization alternates between maximum and minimum levels, $P_H$ and $P_L$, respectively.

940 — Poling the ferroelectric material as heat is removed isothermally at $T_L$ while polarization increases from $P_L$ to $P_H$, thereby generating electrically-opposite screening charges on the pair of electrodes.

950 — Outputting electric energy corresponding to the generated electrically-opposite screening charges on the pair of electrodes when heat is added isothermally to the ferroelectric material at $T_H$ and polarization is reduced from $P_H$ to $P_L$.

FIG. 7

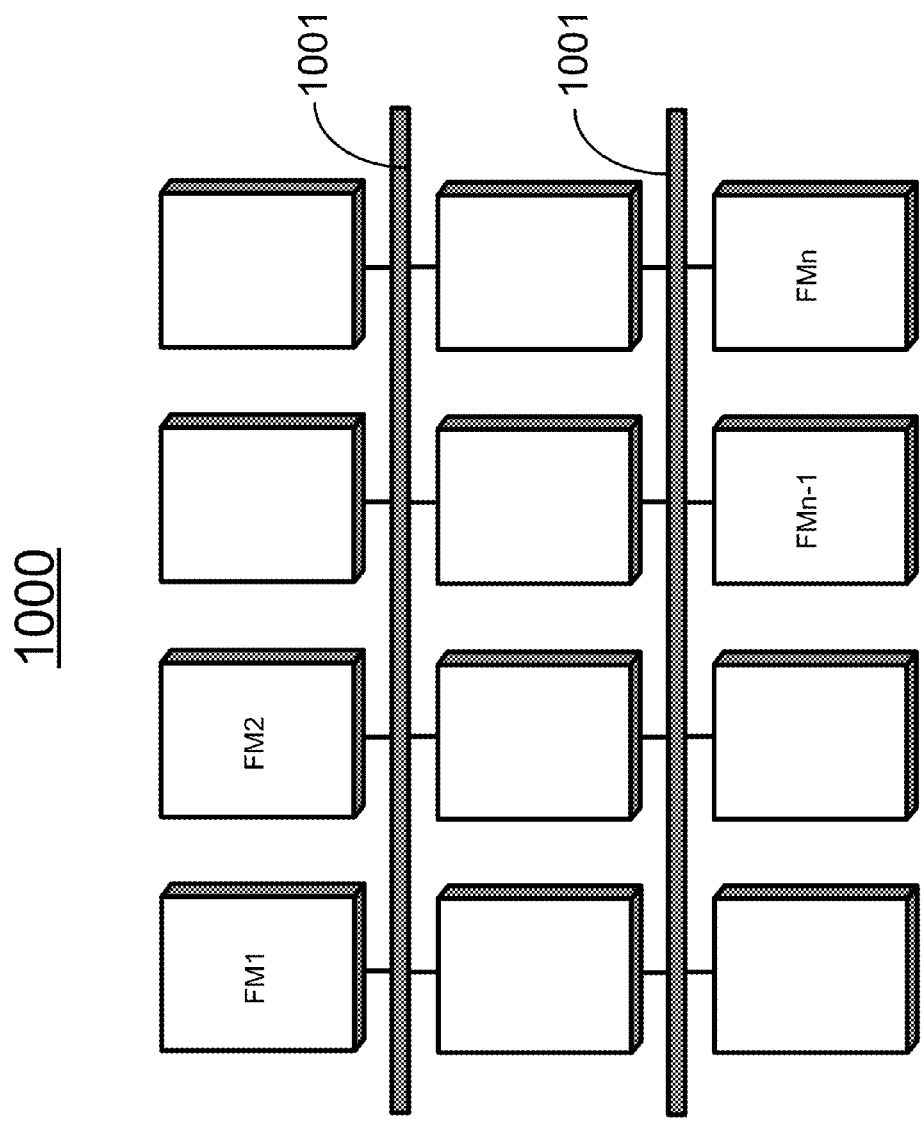

METHOD AND APPARATUS FOR GENERATING ELECTRICITY BY THERMALLY CYCLING AN ELECTRICALLY POLARIZABLE MATERIAL USING HEAT FROM CONDENSERS

CROSS-REFERENCE TO RELATED PATENT APPLICATIONS

This application is a continuation of U.S. patent application Ser. No. 13/272,791, filed on Oct. 13, 2011, pending, which claims the benefit of Provisional U.S. Patent Application Ser. No. 61/406,793, filed Oct. 26, 2010.

U.S. patent application Ser. No. 13/272,791 is also a continuation-in-part of U.S. patent application Ser. No. 13/226,799, filed Sep. 7, 2011, now U.S. Pat. No. 8,344,585, which claims the benefit of provisional U.S. Patent Application Ser. No. 61/387,752, filed Sep. 29, 2010, and which is a continuation-in-part of U.S. patent application Ser. No. 12/465,924, filed May 14, 2009, now U.S. Pat. No. 8,035,274.

U.S. patent application Ser. No. 13/272,791 is also a continuation-in-part of U.S. patent application Ser. No. 13/228,051, filed Sep. 8, 2011, now U.S. Pat. No. 8,350,444, which claims the benefit of provisional U.S. Patent Application Ser. No. 61/387,760, filed Sep. 29, 2010, and which is a continuation-in-part of U.S. patent application Ser. No. 12/465,924, filed May 14, 2009, now U.S. Pat. No. 8,035,274.

U.S. patent application Ser. No. 13/272,791 is also a continuation-in-part of U.S. patent application Ser. No. 13/247,525, filed Sep. 28, 2011, pending, which claims the benefit of Provisional U.S. Patent Application Ser. Nos. 61/390,435, filed Oct. 6, 2010; 61/390,453, filed Oct. 6, 2010; 61/392,781, filed Oct. 13, 2010; 61/392,787, filed Oct. 13, 2010; 61/392,801, filed Oct. 13, 2010; 61/405,516, filed Oct. 21, 2010; and 61/405,918, filed Oct. 22, 2010. U.S. patent application Ser. No. 13/247,525 is also a continuation-in-part of U.S. patent application Ser. No. 13/226,799, filed Sep. 7, 2011, now U.S. Pat. No. 8,344,585, which claims the benefit of provisional U.S. Patent Application Ser. No. 61/387,752, filed Sep. 29, 2010, and which is a continuation-in-part of U.S. patent application Ser. No. 12/465,924, filed May 14, 2009, now U.S. Pat. No. 8,035,274. U.S. patent application Ser. No. 13/247,525 is also a continuation-in-part of U.S. patent application Ser. No. 13/228,051, filed Sep. 8, 2011, now U.S. Pat. No. 8,350,444, which claims the benefit of provisional U.S. Patent Application Ser. No. 61/387,760, filed Sep. 29, 2010, and which is a continuation-in-part of U.S. patent application Ser. No. 12/465,924, filed May 14, 2009, now U.S. Pat. No. 8,035,274.

Each of the above applications is incorporated by reference herein in its entirety.

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference were individually incorporated by reference.

FIELD OF THE INVENTION

The present invention relates to the generation of electricity from condensers. Rejected heat from condensers is converted to electricity with the present invention by utilizing the spontaneous polarization of ferroelectric and other polarizable materials that occurs when they are in their ferroelectric phase, and that diminishes rapidly as the materials approach, or transition into, their paraelectric or antiferroelectric phase with temperature change.

BACKGROUND OF THE INVENTION

Condensers are used to condense a fluid from its vapor phase to its liquid phase in many industrial and other processes. At thermal power plants, condensers typically receive exhaust steam from a low pressure turbine and condense it to water for reuse in the Rankine cycle. Condensers are also used in organic Rankine cycle apparatuses and in other applications. The fluid that undergoes condensation is typically separated from a cooling fluid the condenser uses to remove the heat released during condensation. Typically, the heat removed is rejected to the environment without reuse. Many examples of condenser systems known to those skilled in the art are in use both at thermal plants and in other applications, and the invention can generally be used with any of those condenser systems. Common condenser configurations include, for example, surface condensers and direct and indirect air-cooled condensers.

There is a well recognized need for new technologies that can generate electricity from the heat removed in the condensation process. The present invention discloses a novel way of using the spontaneous polarization of ferroelectrics and other polarizable materials to generate electricity from the thermal energy released in condensers. The invention can be used with condensers in various implementations. The invention can generate electricity using the warmer fluid that is rejected from a condenser as a source of thermal energy, with the cooling fluid that is input to the condenser serving as a heat sink. A condenser can alternatively be configured so that the hot vapor directly contacts the polarizable material. In any implementation, ferroelectric or other polarizable materials are thermally cycled near or through their transition temperatures to cause changes in polarization which can be used to convert thermal energy from the condensation process to electricity.

SUMMARY OF THE INVENTION

The present invention provides methods and apparatus for converting heat from condensers to electric energy using ferroelectric and other polarizable materials that transition into and out of their polar phase spontaneously at desired temperatures. There are two distinct aspects of the invention—one pertains to the extraction of heat from the condenser, and the other pertains to the conversion of that thermal energy to electricity. Condensers are devices that remove heat from a vapor so that it condenses to its liquid phase. Water is the condensed liquid in many applications, but many other fluids are also used. The fluid that undergoes condensation is isolated from a second cooling fluid that flows through the condenser and removes the heat released during condensation. That second fluid is often water, but it can be other fluids, including both liquids and gases such as air. Certain exemplary embodiments of the invention are disclosed herein, but the invention can be used with any condenser with such modifications as may be suitable. The scope of the present invention is intended to include application with any condenser.

In all implementations of the invention, the conversion of thermal energy to electricity requires a heat source at some higher temperature, $T_H$, and a heat sink at some lower temperature, $T_L$, in accordance with the basic laws of thermodynamics. That heat source and heat sink are used in the invention to thermally cycle the ferroelectric material, which allows the apparatus to convert thermal energy to electricity by utilizing the spontaneous polarization of ferroelectric and other polarizable material, and the rapid change in that polarization, that occurs with appropriate cycling.

In one embodiment using a water cooled surface condenser, water circulates in the condenser to remove heat, that water commonly being referred to as circ water. Circ water is input into the condenser at a colder temperature $T_L$ and expelled from the condenser at a warmer temperature $T_H$. In one embodiment of the invention, the warmer circ water at $T_H$ and the cooler circ water at $T_L$ are used as the heat sink and heat source, respectively, for the ferroelectric generator. One or more heat exchangers can be used to facilitate the transfer of heat from the circ water to and from one or more working fluids that, in turn, input and withdraw heat to and from the ferroelectric or other polarizable material in order to thermally cycle it. In another embodiment, a circulating fluid other than water is used to remove heat from the condenser. In yet another embodiment, the transfer of heat to and from the ferroelectric is effected by one or more heat exchangers and a plurality of control valves in communication with the one or more heat exchangers, wherein are positioned first and second fluid passages for alternately delivering a cold fluid and a hot fluid so as to remove heat from and input heat to the ferroelectric, respectively, and wherein the plurality of control valves is adapted for controlling the flow of cold and hot fluids. In one embodiment, the electrical circuit is switched between open and closed positions in coordination with a heating and cooling cycle, an example of such a cycle being described herein.

In other embodiments, rather than using the circ water or other fluid effluent from the condenser as a heat source for the device, the ferroelectric device is integrated into the condenser so that the ferroelectric material is heated directly by contact with the steam or other vapor that is condensed. In one such embodiment, the shell and tube structure of a surface condenser is used; the casing of the tubes serves as a grounded electrode; the ferroelectric material is affixed to the exterior surface of the conducting tubes; and a second electrode is applied to the exterior surface of the ferroelectric material. In one such embodiment, the condenser chamber is subdivided into two or more sections, or a series of condensers is used together. The steam or other gas to be condensed is alternately directed, through one or more valves, to a given section of the condenser apparatus. The ferroelectric is heated to $T_H$ as the vapor condenses and transfers heat to the ferroelectric. By operation of the switching valve under direction of a control circuit, that chamber is closed after it is filled with vapor, and the steam is then directed to the next condenser chamber. As the steam condenses, the condensate water falls into the hotwell, or water box, in a configuration well known to those skilled in the art. The ferroelectric is cooled by the circulation of the cooling water or other fluid in the condenser tubes after the steam valve has been closed so that steam is no longer entering the chamber. The valve is reopened to permit steam to enter the chamber again after heat has been removed from the ferroelectric. The ferroelectric material is thus cycled, thermally and electrically as described herein in various exemplary embodiments, under the direction of a control circuit.

To avoid electrical shorting from the outer electrode to the grounded metals of the condenser in the foregoing embodiment, electrical insulation may be applied in one embodiment at the outer edges of the electrodes where they are in immediate proximity to an electrical ground. In yet another embodiment, a hydrophilic surfactant or similar substance is applied to the outer electrode to facilitate condensation on the surface of the electrode, thereby enhancing thermal communication between the condensing steam or other vapor or gas and the ferroelectric layer. The condenser tubes may be finned in yet another embodiment to enhance thermal transfer.

When the ferroelectric or other polarizable material of the present invention is in its ferroelectric phase and poled, a very strong inherent electric field results spontaneously from the dipoles without induction by an external field. That spontaneous polarization gives rise to dense bound charges on the surfaces of the ferroelectric, which in turn induce opposing screening charges on electrodes that are on the surfaces of the ferroelectric material. By utilization of one or more heat exchangers, the temperature of the ferroelectric is then changed so that it becomes either paraelectric or antiferroelectric, depending upon the particular material used and the phase transition temperature around which the material is cycled. By causing the ferroelectric to go through phase change and rendering the bound surface charges negligible, the screening charges on the electrodes become unscreened and can be removed to external circuitry at high voltage for general purposes.

As disclosed in the above-referenced U.S. patent applications, the temperature of a ferroelectric material can be cycled around its phase transition temperature by inputting and withdrawing heat so that thermal energy can be converted to electrical energy with the invention. Various thermodynamic cycles can be used to exploit spontaneous polarization in ferroelectric and other polarizable materials for the purpose of converting heat to electricity, including the general cycle set forth in U.S. patent application Ser. No. 12/465,924. One exemplary thermodynamic cycle that can be used with the invention is a cycle with two isothermal steps and two steps at constant polarization, as disclosed in U.S. patent application Ser. No. 13/226,799. With that cycle, the ferroelectric is cooled during a first step to a low temperature, $T_L$, while total polarization is held constant at the relatively low value, $P_L$, and the electrical circuit is open. During the next step, heat is withdrawn isothermally until polarization is increased to the maximum value for the cycle, $P_H$, at which point a dense bound charge is present on the surface of the electrode. During that step, the electrical circuit is closed so that a current flows from the electrode on one side of the ferroelectric to the electrode on the opposite side. Screening charges that develop on the electrodes equal the opposing bound charges at the surfaces of the ferroelectric. It is during that step that the poling field causes the resulting dipoles to be biased in one orientation—i.e., they become poled. In the apparatus and method set forth in U.S. patent application Ser. No. 13/228,051, the poling field is generated from residual free charges on the electrodes on the surfaces of the ferroelectric material that remain after discharge.

In the next step of the cycle, the circuit is opened while the ferroelectric is heated to a relatively high temperature, $T_H$, at constant total polarization, $P_H$. During the final step of the cycle, the circuit is closed and heat is input isothermally until polarization is reduced to $P_L$ so that the screening charges on the electrode become unscreened and are discharged into external circuitry at high voltage. All of the charges on the electrode are not removed in one embodiment as disclosed in U.S. patent application Ser. No. 13/228,051. Instead, the circuit is opened at a point where a residual charge remains that is sufficient for poling, that point corresponding to $P_L$. The cycle is then repeated continuously.

The invention can be used in some embodiments with ferroelectrics that are in either solid or liquid form, the latter including liquid ferroelectrics and ferroelectric fine crystals suspended in liquid. For example, the solid materials that can be used include ceramic ferroelectrics, ferroelectric polymers, and other polarizable polymers. In addition to the ordinary ferroelectrics, extrinsic (or improper) ferroelectrics, such as boracites and sodalites, can be used with the invention. Exploiting the spontaneous polarization of ferroelectrics with the present invention allows a robust conversion of heat to electrical energy over the range of temperatures using heat from condensers. Heat can be input to the ferroelectric or withdrawn from the ferroelectric by conduction, convection or radiation or by any combination thereof, and by one or two-phase heat transfer systems.

In one aspect, the present invention relates to an apparatus for converting condenser heat to electricity. In one embodiment, the apparatus includes a ferroelectric layer having a first surface and an opposite, second surface, where the ferroelectric layer is comprised of a ferroelectric material with a phase transition temperature such that, when the material is in a ferroelectric phase spontaneous polarization is established in the material, and the ferroelectric layer, when poled, develops an overall net spontaneous polarization; and such that, as the temperature of the ferroelectric changes so that it traverses the transition temperature, the material enters a paraelectric or antiferroelectric phase wherein the ferroelectric layer has negligible or no overall net polarization.

The apparatus also has a pair of electrodes respectively positioned on the first surface and the second surface of the ferroelectric layer, wherein the electrodes are comprised of a thermally and electrically conductive material, and means positioned in relation to the pair of electrodes for alternately inputting and removing heat to and from the ferroelectric layer so as to, respectively, heat the ferroelectric layer at a temperature $T_H$ that is higher than the phase transition temperature and cool the ferroelectric layer at a temperature $T_L$ that is lower than the phase transition temperature, so that the ferroelectric material thereby undergoes alternating phase transitions between (1) the ferroelectric phase and (2) the paraelectric or antiferroelectric phase.

In another aspect, the present invention relates to an apparatus for converting condenser heat to electricity. In one embodiment, the apparatus includes a ferroelectric layer having a first surface and an opposite, second surface. The ferroelectric layer consists of a ferroelectric material characterized with a Curie temperature, $T_c$, such that when the temperature of the ferroelectric material is lower than the Curie temperature $T_c$, the ferroelectric material is in a ferroelectric phase in which spontaneous polarization is established, and when the temperature of the ferroelectric material is greater than the Curie temperature $T_c$, spontaneous polarization is not established in the ferroelectric material. The apparatus also includes a pair of electrodes positioned respectively on the first surface and the second surface of the ferroelectric layer. The pair of electrodes is comprised of a thermally and electrically conductive material.

Furthermore, the apparatus includes means positioned in relation to the pair of electrodes for alternately delivering a cold fluid and a hot fluid so as to alternately (1) cool the ferroelectric layer at a first temperature $T_L$ that is lower than the Curie temperature $T_c$, and (2) heat the ferroelectric layer at a second temperature $T_H$ that is higher than the Curie temperature $T_c$, so that the ferroelectric material of the ferroelectric layer thereby undergoes alternating phase transitions between the ferroelectric phase and the paraelectric phase with temperature cycling.

Additionally, the apparatus may have a pair of electric leads connected to the pair of electrodes such that when the ferroelectric material is cycled to diminish the total polarization of the ferroelectric layer, the electric energy corresponding to the electrically-opposite screening charges is output to the pair of electric leads at high voltage. The electric leads may also be connected through a switch to permit application of a DC voltage between the pair of electric leads to create a poling field to be applied when the ferroelectric material is in, or transitioning into, its ferroelectric phase. Moreover, the apparatus may include means for monitoring one or more of the temperature and capacitance of the ferroelectric layer and the temperature and pressure of the heating and cooling fluids.

In another embodiment, the delivering means comprises a first fluid passage and a second fluid passage formed on, at, or adjacent to the pair of electrodes, respectively, such that when a cold fluid passes through at least one of the first and second fluid passages, the ferroelectric layer is cooled, and when a hot fluid passes through at least one of the first and second fluid passages, the ferroelectric layer is heated; one or more heat exchangers positioned such that the first and second fluid passages alternately deliver a cold fluid and a hot fluid to alternately cool the ferroelectric layer at a first temperature $T_L$ and heat the ferroelectric layer at a second temperature $T_H$; and a plurality of control valves in communication with the one or more heat exchangers for controlling the flow of cold and hot fluids. The plurality of control valves is controlled by microcontrollers, and they are coordinated by computer control with the electrical circuitry of the device through a control circuit to achieve the desired cycle, some examples of which are described herein.

In yet another aspect, the present invention relates to a method for converting condenser heat to electricity. In one embodiment, the method includes the steps of providing a ferroelectric layer having a first surface and an opposite, second surface, wherein the ferroelectric layer is comprised of a ferroelectric material with a phase transition temperature such that, when the material is in a ferroelectric phase spontaneous polarization is established in the ferroelectric, and the ferroelectric layer, upon poling, develops an overall net spontaneous polarization, and such that, as the temperature of the ferroelectric changes so that it traverses the transition temperature, the material enters a paraelectric or antiferroelectric phase wherein the ferroelectric layer has negligible or no overall net spontaneous polarization; and including a pair of electrodes positioned respectively on the first surface and the second surface of the ferroelectric layer, the electrodes being comprised of a thermally and electrically conductive material.

The method also includes the steps of alternately delivering a cold fluid and a hot fluid so as to alternately cool the ferroelectric layer to a temperature that is lower than the Curie temperature, $T_c$, and heat the ferroelectric layer to a second temperature that is higher than the Curie temperature $T_c$. During these steps in one embodiment, the electrical circuit is opened and cooling and heating occur under constant polarization. In one embodiment, the hot fluid comprises the vapor that is condensed by the condenser.

The method also includes the steps of alternately providing and removing heat to and from the ferroelectric layer, isothermally, by alternately delivering a flow of hot fluid and a flow of cold fluid as to alternately add or remove heat to the ferroelectric layer while total polarization changes to corresponding low and high levels denoted as $P_L$ and $P_H$ respectively. During these steps in one embodiment, the electrical circuit is closed to allow changing polarization, and the heat removed or added corresponds to the enthalpy of transition. In one embodiment, the hot fluid comprises the vapor that is condensed by the condenser.

The method also includes poling the ferroelectric material of the ferroelectric layer in the ferroelectric phase at temperature $T_L$. In one embodiment, the poling is performed by a field that results from residual free charges on the electrodes that are on the surfaces of the ferroelectric. The method also includes the step of discharging the electrical energy generated in the ferroelectric material of the ferroelectric layer into external circuitry by closing the circuit while heat is being input into the ferroelectric layer isothermally and polarization diminishes to a minimum level, $P_L$. $P_L$ corresponds to the residual charge that is adequate to establish a field sufficient for poling. In another embodiment, poling is accomplished by applying a small poling field from a DC voltage source. In that embodiment, the minimum polarization can become negligible or zero during the step in which the electrical energy generated in the ferroelectric material of the ferroelectric layer is discharged into external circuitry.

In other embodiments, instead of cycling the ferroelectric material through phase transition, it remains in a ferroelectric phase throughout and is cycled from a greater degree of polarization to a lesser degree of polarization.

In addition to materials with a crystal structure, amorphous polymer materials that are electrically polarizable can be used with the invention. For such amorphous polymers, the polarizable units exhibit electric dipolar behavior at the atomic and molecular level. An overall net polarization occurs with such polarizable amorphous polymer and copolymer systems when poled, and that net polarization diminishes and disappears when the temperature of the material traverses the depolarization transition temperature. The changes in polarization that occur with cycling of such amorphous polymer systems around their depolarization transition temperatures are exploited by the invention in the same general fashion as the invention uses the spontaneous polarization, and changes in polarization, that occur in crystalline ferroelectric materials. For amorphous materials, the depolarization transition temperature is analogous to $T_c$ or to the ferroelectric phase transition. Where reference is made to the use of ferroelectric materials and ferroelectric layers in the invention, it should be understood that polarizable amorphous polymers and copolymers with appropriate polarization and transition characteristics can also be used with the invention.

A single stage ferroelectric power conversion module includes a single ferroelectric material. As such, it generally has a single phase transition temperature reflecting the transition between the ferroelectric phase and the paraelectric or the antiferroelectric phase. The temperature differential between the heat source and heat sink ($\Delta T = T_H - T_L$) in the condenser implementations of the invention are typically not great. It may be desirable, however, to use a series of more than one ferroelectric material that has a succession of phase transition temperatures that incrementally cover the range of temperatures between the heat source and heat sink. The desirability of using multiple ferroelectrics will depend on various factors, including, for example, the sharpness of the phase transition.

Multiple ferroelectrics can be used where the heated liquid effluent from the condenser serves as a heat source. In one embodiment, a multi-stage apparatus has a plurality of ferroelectric modules, $\{FM^n\}$, arranged in a stack, where n=1, 2, 3, . . . N, N being an integer greater than one. Each ferroelectric module $FM^n$ includes a ferroelectric layer having a first surface and an opposite, second surface, wherein the ferroelectric layer is formed of a ferroelectric material characterized with a transition temperature, $T^n$, such that when the ferroelectric material is in a ferroelectric phase, spontaneous polarization is established in the unit cells of the ferroelectric, and the ferroelectric layer, upon poling, develops an overall net spontaneous polarization, and such that, as the temperature of the ferroelectric changes so that it traverses the transition temperature, the material enters a paraelectric or antiferroelectric phase wherein the ferroelectric layer has negligible or no overall net spontaneous polarization. In one embodiment, a pair of electrodes consisting of a thermally and electrically conductive material is positioned on the first surface and the second surface of the ferroelectric stack. In another embodiment, such electrodes are also positioned on the first surface and the second surface of each ferroelectric module, $FM^n$; and in yet another embodiment, such electrodes between adjacent ferroelectric modules are separated by an electrical insulator. The transition temperatures $\{T^n\}$ of the plurality of ferroelectric modules $\{FM^n\}$ may vary successively across the range between temperatures of a heat source and a heat sink.

The apparatus further includes means positioned in relation to the stacked ferroelectric modules $\{FM^n\}$ for alternately inputting and removing heat to and from the stacked ferroelectric modules $\{FM^n\}$ so as to alternately cool the stacked ferroelectric modules $\{FM^n\}$ at a first temperature that is lower than each transition temperature $T^n$, and heat the stacked ferroelectric modules $\{FM^n\}$ at a second temperature that is higher than each transition temperature $T^n$, such that each ferroelectric layer of the stacked ferroelectric modules $\{FM^n\}$ thereby undergoes alternating phase transitions between (1) the ferroelectric phase and (2) the paraelectric or antiferroelectric phase.

The apparatus may further include devices to monitor, among other things, one or more of the temperature and capacitance of one or more ferroelectric modules $FM^n$ and the temperature and pressure of the heating and cooling fluids. Thermal cycling is coordinated with the electrical status of the ferroelectric modules $\{FM^n\}$ under computer control so as to synchronize heating and cooling with electrical input and output, pursuant to the general cycle of the invention, including poling and electrical discharge.

In yet a further aspect, the present invention relates to an apparatus for converting condenser heat to electric energy. In one embodiment, the apparatus has a plurality of ferroelectric modules, $\{FM^n\}$, arranged in a stack, where n=1, 2, 3, . . . N, N being an integer greater than one. Each ferroelectric module $FM^n$ includes a ferroelectric layer having a first surface and an opposite, second surface, wherein the ferroelectric layer is formed of a ferroelectric material characterized with a Curie temperature, $T_c^n$, such that when the temperature of the ferroelectric material is lower than the Curie temperature, $T_c^n$, the ferroelectric material is in a ferroelectric phase in which spontaneous polarization is established in the ferroelectric material, and when the temperature of the ferroelectric material is greater than the Curie temperature, $T_c''$, spontaneous polarization is not normally established in the ferroelectric material; and in one embodiment a first electrode and a second electrode are positioned on the first surface and the second surface of the ferroelectric stack, respectively; and in another embodiment a first electrode and a second electrode are positioned on the first surface and the second surface of each ferroelectric module, $FM''$. Different ferroelectric layers of the plurality of ferroelectric modules $\{FM''\}$ are comprised of an identical ferroelectric material or different ferroelectric materials. In one embodiment where a first electrode and a second electrode are positioned on the first surface and the second surface of each ferroelectric module, $FM''$, each two adjacent ferroelectric modules are separated by an electrical insulator. The Curie temperatures $\{T_c''\}$ of the plurality of ferroelectric modules $\{FM''\}$ may vary successively across the range between temperatures of a heat source and a heat sink.

The apparatus further includes means positioned in relation to the stacked ferroelectric modules $\{FM''\}$ for alternately delivering a cold fluid and a hot fluid over the stacked ferroelectric modules $\{FM''\}$ so as to alternately cool the stacked ferroelectric modules $\{FM''\}$ at a first temperature that is lower than each Curie temperature $T_c''$, and heat the stacked ferroelectric modules $\{FM''\}$ at a second temperature that is higher than each Curie temperature $T_c''$, thereby each ferroelectric layer of the stacked ferroelectric modules $\{FM''\}$ undergoes alternating phase transitions between the ferroelectric phase and the paraelectric phase with temperature cycling.

In other embodiments, the apparatus uses the multi-stage construction of the ferroelectric layers as described, but the multi-layer ferroelectric is integrated into the condenser so that it is heated by direct thermal contact with the vapor or other gas being condensed. A multi-layer ferroelectric can be affixed directly to the exterior surface of the condenser tubes with the layer having the lowest transition temperature being adjacent to the casing. One or more other electrodes are part of the multi-layer ferroelectric as described hereinabove. The condenser chamber is otherwise configured as described for the one-stage embodiment such that the condensing vapor provides heat to the ferroelectrics. The ferroelectrics are cooled by the circ water or other fluid in the condenser tubes. The multi-stage ferroelectric material is thermally and electrically cycled under the direction of a control circuit.

The apparatus may further include devices to monitor the temperature and capacitance of one or more ferroelectric modules $FM''$ and the temperature and pressure of the heating and cooling fluids. Thermal cycling is coordinated with the electrical status of the ferroelectric modules $\{FM''\}$ through a control circuit to synchronize heating and cooling with electrical input and output, pursuant to any of the thermodynamic cycles that can be used with the invention, including the cycle that utilizes two isothermal steps and two steps at constant polarizations, together with poling and electrical discharge.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more aspects or embodiments of the invention and, together with a written description, serve to explain the principles of the invention. Where practical, the same reference numbers are used throughout the drawings to refer to the same or like elements of an embodiment, wherein:

FIG. 7 is a flow chart of a process for converting heat to electric energy according to one embodiment of the present invention.

FIG. 8 shows schematically a ferroelectric device for converting heat to electric energy according to one embodiment of the present invention.

DETAILED DESCRIPTION OF THE INVENTION

Figure 1:
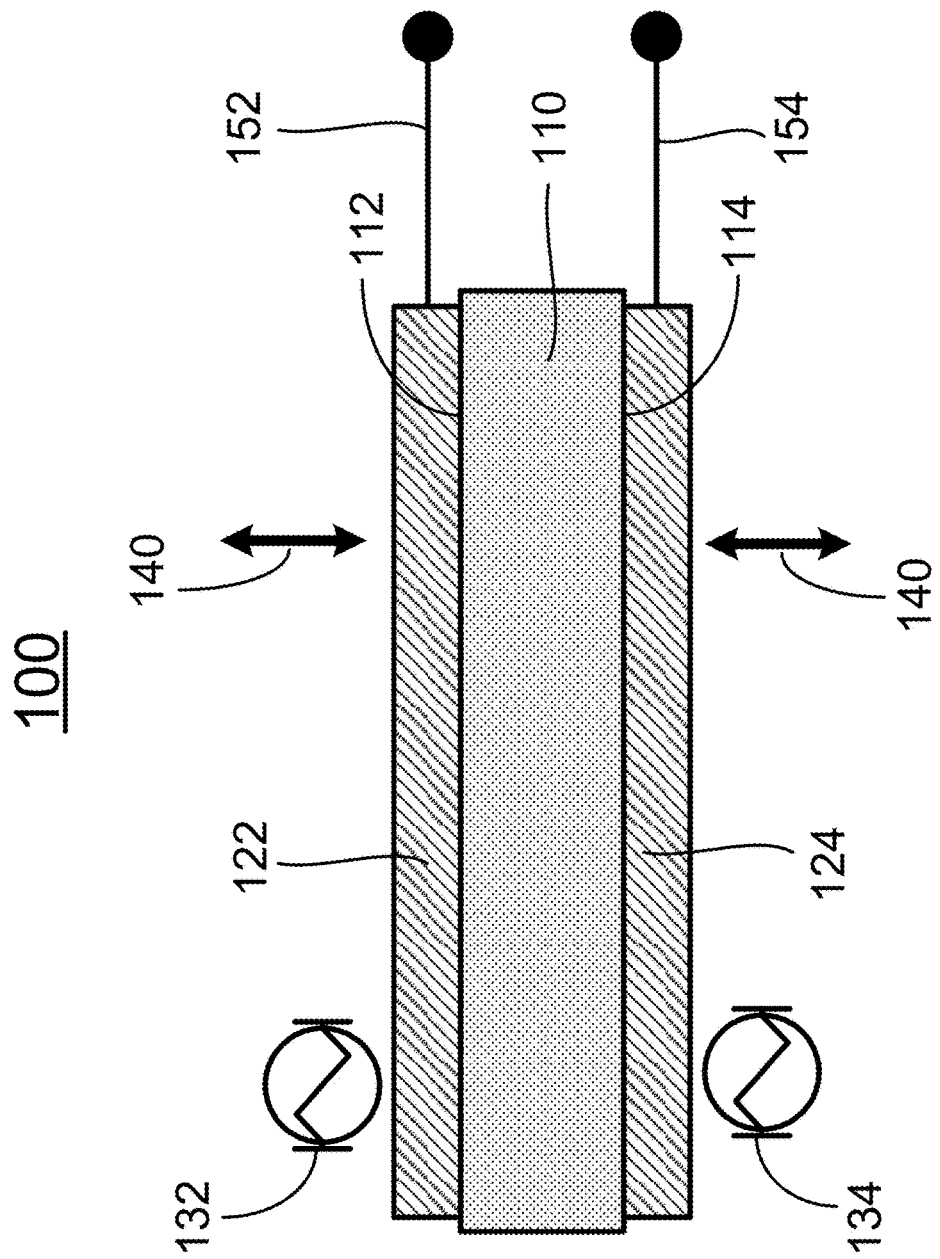
FIG. 1 is a cross-sectional schematic view of a ferroelectric device for converting heat to electric energy that utilizes changes in spontaneous polarization that occurs in temperature cycling to generate electric charges that can be removed to external circuitry at high voltage, according to one embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Additionally, some terms used in this specification are more specifically defined below.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. The use of examples anywhere in this specification, including examples of any terms discussed herein, is illustrative only, and in no way limits the scope and meaning of the invention or of any exemplified term. Likewise, the invention is not limited to various embodiments given in this specification.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the term "unit cell" refers to a crystal structure that is a unique arrangement of atoms in a crystal. A crystal structure is composed of a motif, a set of atoms arranged in a particular way, and a lattice. Motifs are located upon the points of a lattice, which is an array of points repeating periodically in three dimensions. The points can be thought of as forming identical tiny boxes, called unit cells, that fill the space of the lattice. The lengths of the edges of a unit cell and the angles between them are called the lattice parameters. The crystal structure of a material or the arrangement of atoms in a crystal structure can be described in terms of its unit cell. The unit cell is a tiny box containing one or more motifs, a spatial arrangement of atoms. The unit cells stacked in three-dimensional space describe the bulk arrangement of atoms of the crystal. The crystal structure has a three dimensional shape. The unit cell is given by its lattice parameters, the length of the cell edges and the angles between them, while the positions of the atoms inside the unit cell are described by the set of atomic positions measured from a lattice point.

As used herein, the term "Curie temperature" or T$_c$ refers to a characteristic property of a ferroelectric material. At temperatures below the Curie temperature, the ferroelectric material generally is in a ferroelectric phase in which spontaneous polarization is established in the unit cells of the ferroelectric material. As the temperature is increased towards the Curie temperature, the spontaneous polarization established in the unit cells decreases. Above the Curie temperature, the ferroelectric material is generally in a paraelectric phase in which spontaneous polarization is not established in the unit cells of the ferroelectric material. There are ferroelectrics, however, where a ferroelectric phase exists at temperatures above the transition temperature, and the material is paraelectric below that transition temperature. Also, there are transition temperatures between ferroelectric and antiferroelectric phases that are relevant to the invention, as described herein, and the ferroelectric phase may occur at a higher temperature than the antiferroelectric phase. There does not appear to be a clearly established usage as to whether "Curie temperature" also applies to the transition temperatures for these latter kinds of phase transitions. The terms "phase transition temperature"

and "transition temperature" are used herein to include all of the foregoing types of phase transitions. "Curie temperature" or $T_c$ may be used only in conjunction with the first type of phase transition, or it may be used more broadly when apparent from the context.

In practice, for all of the above described types of phase transitions, the sharpness of the phase change as the material temperature crosses the transition temperature is determined by the homogeneity of the composition and the crystal structure, such that the transition between phases may take place progressively as the temperature of the ferroelectric material increases or decreases over a temperature range around the designated transition temperature of the material.

Whenever the use of ferroelectric materials are disclosed herein, it is intended that such use include both ordinary and improper ferroelectrics, with the ferroelectric material being cycled with respect to its phase transition as described. With extrinsic ferroelectrics, polarization represents a second order parameter, which is coupled to some primary order parameter.

In addition to ferroelectric materials with a crystal structure, amorphous materials that are polarizable can be used with the invention. Some such materials provide a very robust basis for converting thermal energy to electricity. For such amorphous materials, the depolarization transition temperature is analogous to $T_c$ or the ferroelectric phase transition temperature as described above. Whenever the use of ferroelectric materials is disclosed herein, it is intended that that use include the cycling of such polarizable amorphous materials. In that instance, the polarizable amorphous material is cycled like the ferroelectric material, with the depolarization transition temperature being used in the cycle in lieu of the ferroelectric phase transition temperature. In such amorphous materials and in polymer ferroelectric materials, the polarizable units exhibit electric dipolar behavior at the atomic and molecular level.

Various polarizable amorphous materials are of particular utility with the invention because their depolarization transition temperatures are in a range generally less than ~250° C. that is particularly useful with condensers, and they produce a robust discharge of electrical energy when cycled. The relationship between energy, polarization, and permittivity is:

$$U = P^2 / 2 \in \in_0.$$

While P is generally smaller with such amorphous polymers than is the case, for example, with ferroelectric ceramics, the permittivity for such materials is much smaller, thereby increasing energy density, U.

On occasion, "polarization" is used herein where it might be more precise to refer to "electric displacement." Since there is no significant difference between the terms in this context, polarization is used throughout for simplicity and clarity.

Without intent to limit the scope of the invention, exemplary apparatuses and methods and their related results according to the embodiments of the present invention are given below. Note that titles or subtitles may be used in the examples for convenience of a reader, which in no way should limit the scope of the invention. Moreover, certain theories are proposed and disclosed herein; however, in no way, whether they are right or wrong, should they limit the scope of the invention so long as the invention is practiced according to the invention without regard for any particular theory or scheme of action.

In accordance with the purposes of this invention, as embodied and broadly described herein, this invention, in one aspect, relates to an apparatus and method for converting condenser heat to electricity using ferroelectric or other polarizable materials and without the energy passing through intermediate mechanical mechanisms or through other forms. The invention exploits the large inherent spontaneous polarization that develops in ferroelectric materials when they are in their ferroelectric phase. The spontaneous polarization that arises in the ferroelectric or other polarizable materials that is exploited by the invention occurs without application of an external field. The cooperative alignment of the electric dipoles occurs spontaneously as a result of the material transitioning into a ferroelectric phase, which produces a large overall net polarization in the material as a whole when the polarizable units and domains have been aligned by poling. The invention further exploits the large changes in overall net spontaneous polarization that occur when a change in the temperature of the ferroelectric or other polarizable material causes a transition to a phase that has negligible net polarization.

The invention permits the removal and use of the electrical energy generated by the spontaneous polarization that occurs when the material is in the ferroelectric phase. The electrical energy so generated can be exported to external circuitry in conjunction with phase transition of the material from the ferroelectric phase to a non-polar phase. The inherent net spontaneous polarization, $P_s$, disappears as the material transitions to a non-ferroelectric phase. Commonly, the phase transition that renders $P_s$ negligible will be from the ferroelectric phase to the paraelectric phase, but it may also be from the ferroelectric phase to the antiferroelectric phase, since the antiferroelectric phase produces negligible net spontaneous polarization in the material overall.

To allow the conversion of thermal energy to electrical energy with the invention, the basic ferroelectric module is cycled around its phase transition temperature. That temperature cycling is accomplished by one or more heat exchangers that interface between the ferroelectric module and a heat source and heat sink. The heat exchangers and heat source are not limited and may include any mode by which thermal energy is transferred, including convective, conductive and radiative transfer, and one and two-phase thermal transfer systems. The invention can be used generally to convert condenser heat to electricity where: (1) at least a portion of the temperature range between the heat source temperature, $T_H$, and heat sink temperature, $T_L$, are within the range of phase transition temperatures for one of the many ferroelectric materials that exist; and (2) the temperature difference, $\Delta T = T_H - T_L$, is sufficient to allow effective conversion.

There are ferroelectrics with phase transition temperatures that range from as low as about 0° C. to greater than 700° C. It will be recognized by persons skilled in the art that some temperatures within that range are appropriate for converting condenser heat to electricity, the applicable temperatures varying with the type of condenser and its application and operation. Commonly, $T_H$ for a condenser will be less than 100° C., but there is no theoretical limit to the operating temperature of the apparatus or method, and they can be used at any temperatures insofar as appropriate ferroelectrics are available and condenser heat and a heat sink are available for such temperatures.

It will be recognized by persons skilled in the art that some temperature gradient will exist between the ferroelectric material and the heat source that is at $T_H$ and the heat sink that is at $T_L$. While that gradient is often disregarded in quasistatic thermodynamic analyses that assume an ideal isothermal heat transfer between the working medium— which here is the ferroelectric—and the heat source and sink, the flow of heat requires some gradient in practice. For simplicity, that gradient is disregarded here and $T_H$ may be used to designate both the temperature of the heat source and the temperature to which the ferroelectric is heated. Similarly, $T_L$ may be used to designate both the temperature of the heat sink and the temperature to which the ferroelectric is cooled. In practice, the extent of the actual gradient may affect the overall thermal efficiency, power density, and other factors.

In the implementation of the invention that uses condenser effluent as the heat source at $T_H$, the invention is not limited or specific to any particular heat exchanger format or configuration. Similarly, in the implementation of the invention that uses the condensing vapor or gas to directly input heat to the ferroelectric device without an intermediate transfer of that heat through a heat exchanger or otherwise, the invention is not limited or specific to any particular format or configuration. Rather, the device is general and may be used to convert condenser heat to electricity in any configuration that allows the one or more ferroelectrics to be thermally cycled as described herein. In various configurations, heat input and withdrawal to and from the ferroelectric to cause temperature and phase cycling can be accomplished by thermal transport through convection, conduction or radiation, and by one or two-phase heat transfer systems.

In general, different materials can be used to practice the present invention. A particular ferroelectric will be effective in converting heat to electrical energy when cycled around its phase transition temperature or temperatures. As noted, the phase transition that often will be utilized with the invention is that from ferroelectric to paraelectric and back to ferroelectric. However, the phase transition from ferroelectric to antiferroelectric and back may also be utilized with the invention. First order transitions are common among ferroelectric materials, and many first order transition materials are appropriate for use with the invention. Ferroelectric materials that exhibit second order transitions may also be used with the invention.

Criteria that affect the suitability of a ferroelectric material for a particular application include: (1) a phase transition temperature that matches the available range of thermal energy from the heat source and heat sink; (2) the sharpness of the phase transition of that material as a function of temperature; (3) the energy released during transition from a polarized state to a non-polarized state, as expressed by $U=P^2/2\in\in_0$ (with high permittivity ferroelectrics, spontaneous polarization in the ferroelectric state is preferably ≥2 μC cm$^{-2}$, but amorphous polymers with much lower polarization may be used since they may have very low permittivity); (4) a sufficiently high resistivity to avoid the charges on the electrodes from leaking through the ferroelectric medium before the stored electrical energy can be removed externally at high voltage; and (5) a comparatively high ferroelectric transition energy, or enthalpy, in comparison to the energy required to heat the lattice during cycling (this factor will depend in part on the magnitude of the temperature difference between the high and low cycling temperatures).

A great variety of ferroelectric materials can be used with the invention, as particular material families are subject to virtually endless variation to optimize their performance, including their transition temperature. Ferroelectrics that can be used for condenser temperature ranges of, for example, 10-80° C., include imidazolium tetrafluoroborate modified with perchlorate as an anionic substitution to control the transition temperature and energy; methylammonium bismuthbromide; modified and unmodified triglycine sulfate; and transition metal boracites such as copper, nickel and cobalt boracites. These ferroelectric materials can have ferroelectric transition enthalpies in the range of 5-70 kJ/L and sharp phase transitions with transition widths as small as 3° C. or less. In these exemplary ferroelectric materials, precise control of the transition temperature can be achieved through substitution of the appropriate atoms and molecules to achieve phase transition temperatures across a range of 10-80° C. or more.

Many other ferroelectric materials can be used with the invention, particularly since the specific performance characteristics of the material can be modified by varying the percentages of the constituent elements. A list of some of the many ferroelectrics and antiferroelectrics that may be used with the invention is set forth in M. Lines and A. Glass, PRINCIPLES AND APPLICATIONS OF FERROELECTRICS AND RELATED MATERIALS, APP. F (1977, Oxford reprint 2004), though the list is not exhaustive. Appendix F is incorporated herein. The invention can be used with ferroelectrics that are in either solid or liquid form, the latter including, for example, liquid ferroelectrics and ferroelectric fine crystals suspended in a liquid appropriate for a particular application. The solid materials that can be used include ceramic ferroelectrics, ferroelectric polymers, and other polarizable polymers by way of example. In polymer systems, the phase transition temperature can be varied and controlled by forming copolymers and blends. An example of a polarizable amorphous material that can be used with the invention is MXD6 Nylon, which has a transition temperature of approximately 78 C and has produced measured discharge voltages of approximately 800 V for a sample 70 μm thick.

In various embodiments of the present invention, heat is converted to electricity using ferroelectric or other polarizable materials which transition into and out of the polar phase at specified temperatures. The material is thermally cycled using heat from the condenser and a heat sink such as the cooling fluid used to cool the condenser. That thermal cycling allows the apparatus to convert thermal energy to electricity by utilizing the spontaneous polarization and the rapid change in that polarization that occurs with cycling. By poling the electric dipoles so as to align the polarizable units and domains, the polarization of the cooperatively acting individual electric dipoles combines to produce a large net spontaneous polarization in the overall material system. That large net polarization, in turn, induces electrically opposite screening charges on the electrodes on either side of the ferroelectric material, and ultimately those screening charges are removed as electrical energy, as described in more detail herein.

Using condenser effluent as a source of thermal energy. Condensers are a type of heat exchanger used to condense vapor into liquid by removing heat from the vapor. There are many kinds and configurations of condensers known to those skilled in the art, and generally any of them can be used with the invention. Condensers are used in many applications. At thermal power plants, for example, a surface condenser, or water-cooled shell and tube heat exchanger, typically receives the exhaust steam from the steam turbine and condenses it to water in a Rankine cycle.

Figure 24:
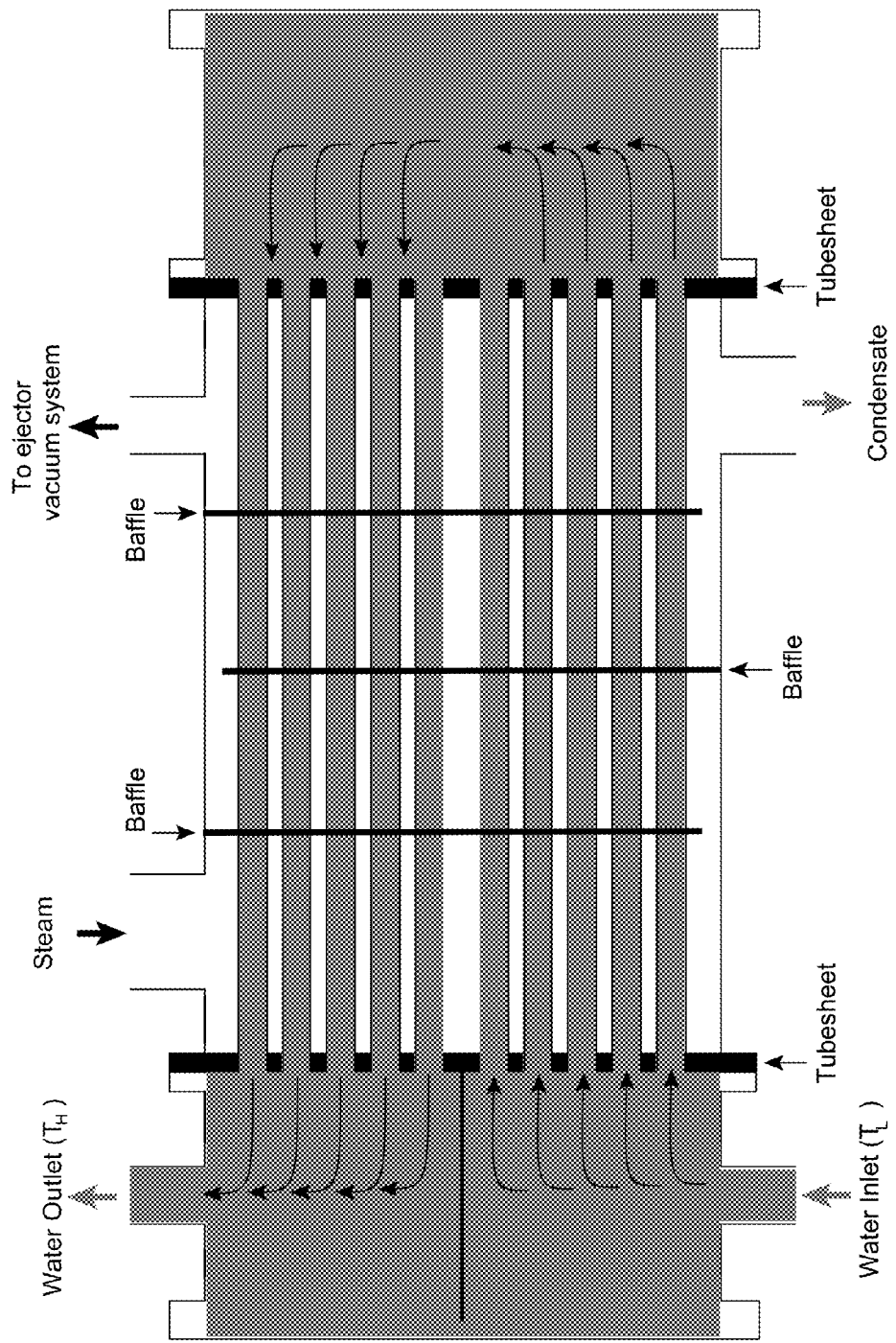
FIG. 24 illustrates schematically a water cooled surface condenser.
Figure 25:
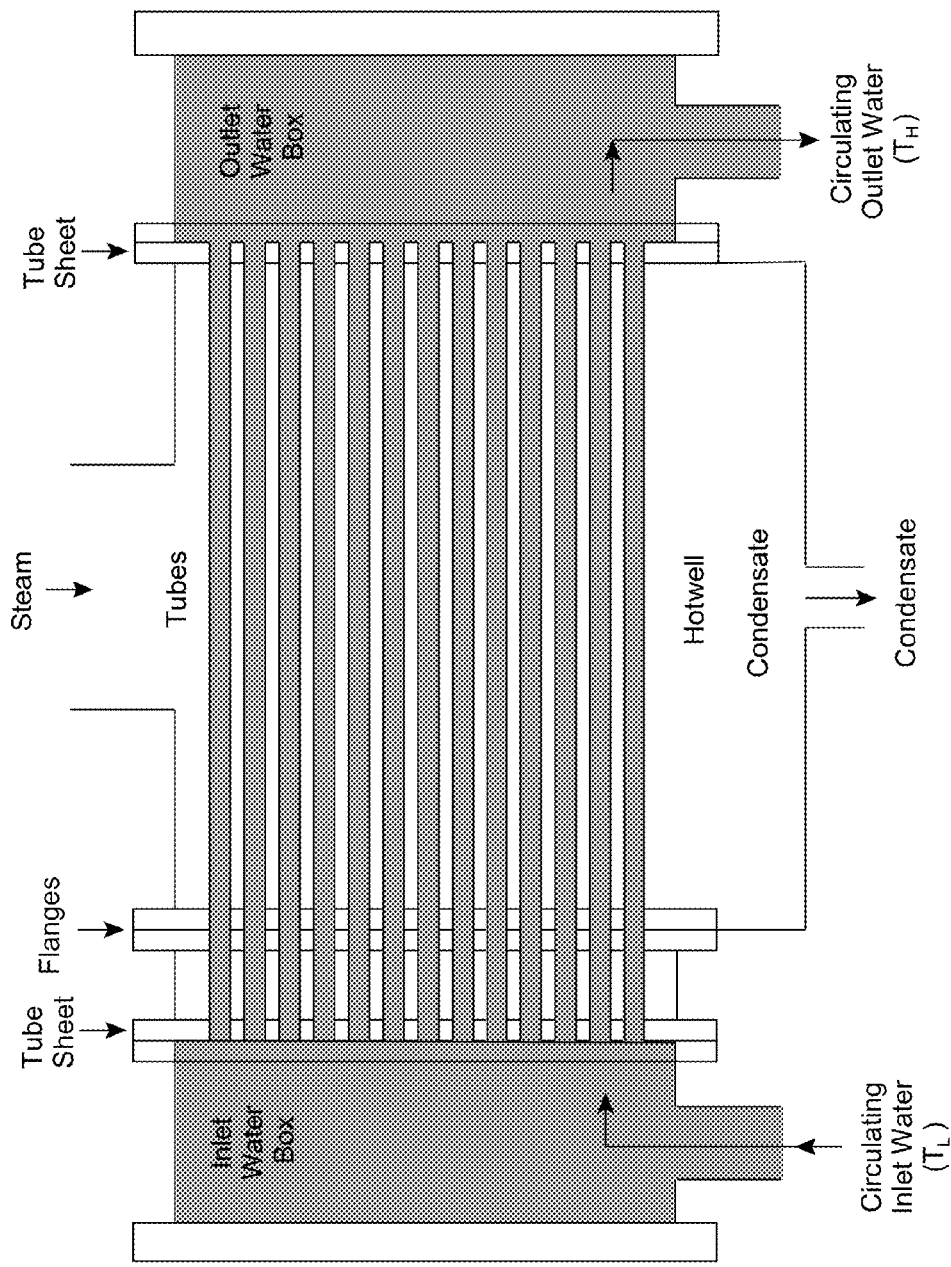
FIG. 25 is a schematic of a typical condenser used at thermal power plants. This condenser is single-pass for both the tube and shell sides with a large opening at the top for the exhaust steam to enter and a hotwell at the bottom where condensate water collects.

Examples of such condensers are shown schematically in FIGS. 24 and 25, where circulating cooling water at a temperature $T_L$ enters the water inlet and passes through a set of tubes, ultimately exiting the condenser through the water outlet at a higher temperature $T_H$. Turbine exhaust steam enters the condenser chamber where it is cooled by contact with the tubes through which the cooling water passes. In the illustrative depiction in FIG. 24, a series of baffles are present in the steam chamber. In the devices illustrated in FIGS. 24 and 25, condensed exhaust steam falls to the bottom of the condenser, is removed as condensate, and is then reused in the Rankine cycle. The exhaust steam is segregated from the cooling water, which exits the condenser at the higher temperature $T_H$ because of the heat received from the condensing steam.

Figure 23:
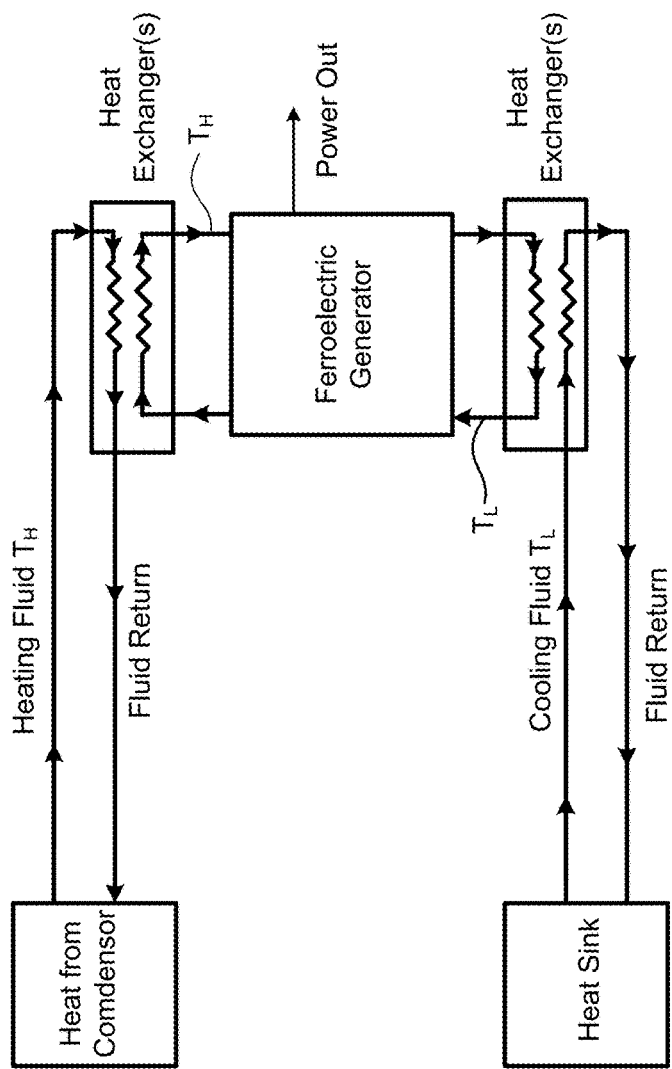
FIG. 23 is a schematic diagram that illustrates the overall apparatus whereby condenser heat is used, with one or more heat exchangers, to heat working fluids that are then used to provide heat to the ferroelectric generator; and a heat sink that provides one or more working fluids through one or more heat exchangers to remove heat from the ferroelectric generator.

Such condensers and others used at power plants, and condensers used in many other applications, can be used with the invention. Where sufficient cooling water is not available, direct or indirect air cooled condensers may be used. Condensers that use cooling fluids other than water or air can be used with the invention, and devices that condense vapor other than steam can be used with the invention. In one implementation of the invention as illustrated in FIG. 23, rejected condenser heat is recovered and transferred to one or more working fluids through one or more heat exchangers, and those working fluids are then used to provide heat to the ferroelectric generator in order to cycle the material in accordance with a thermodynamic cycle, as described herein, so as to convert heat to electricity. As illustrated in FIG. 23, a heat sink is also coupled through one or more heat exchangers to the ferroelectric generator to remove heat rejected during cycling. By way of example, in one embodiment the cooling fluid that is input into the condenser at $T_L$, as illustrated in FIGS. 24 and 25, is used as the heat sink, and that same fluid serves as the heat source when it exits the condenser at $T_H$.

The invention can be practiced with many different heat exchangers operating between the ferroelectric generator and condenser, as depicted schematically in FIG. 23. The embodiments provided here are representative of many kinds of condensers where circ water, or another cooling fluid, can be used to provide both a heat source and a heat sink for the ferroelectric generator of the invention. Apparatuses and methods of heat transfer and heat exchanger mechanisms that may be used with the invention are well known to those skilled in the art.

Integrating the ferroelectric converter into the condenser. In other embodiments, the ferroelectric device described herein is integrated into the condenser so that it receives heat directly from the condensing vapor. In these embodiments, the ferroelectric device is heated by direct thermal contact with the vapor that is condensed. By allowing the converter to take the latent heat released directly from the vapor during condensation, a greater operating $\Delta T$ for the ferroelectric generator can be attained, which in turn affords the generator greater potential thermal efficiency, the maximum such efficiency $\eta_c$ equaling $\Delta T/T_H$.

Many configurations and designs for such condensers, including common surface shell and tube heat exchangers, are well known to those skilled in the art, and the invention can generally be used as described herein with any such condenser when modified to fit the geometry and operation of the apparatus. In one such embodiment, the invention uses a shell and tube structure of a typical surface condenser, as represented generally in FIGS. 24 and 25. Cooling circ water flows through the tubes to remove heat to the ambient, as in a traditional condenser. The tubes are constructed, however, by affixing the ferroelectric converter described herein to the outside surfaces of the tubes within the condenser, which tubes are made of thermally and electrically conductive material. It is desirable that the tubes be thin walled to minimize impediments to thermal conduction. A thicker tube wall will slow thermal transfer proportional to thickness for the same total temperature differential across the wall; conversely, to maintain the same rate of thermal transfer across a thicker tube wall, the temperature differential would need to increase proportional to thickness, which would decrease the thermal efficiency of the apparatus. Thin wall tube construction is also desirable in traditional condensers for various reasons, including efficiency and economics. Tubes may be supported in the condensers by baffles, plates, and other devices to permit thinner tube wall construction. Tube sizes in traditional condensers are typically 15 to 50 mm OD, and such sizes and other sizes may be used with the invention. Sizing considerations relate to economics, efficiency, power density, and the length of the tubes, among other considerations.

The material of which the tubes are constructed will depend in part on the particular application. Many materials can be used for thin wall construction and are well known to those skilled in the art. Fouling resistance and high thermal conductivity, as well as resistance to erosion corrosion, pitting, crevice corrosion, microbiologically induced corrosion, and general corrosion, are some of the considerations in material selection. Copper alloys can be used but may present problems in high pressure boiler and nuclear reactor systems because of the potential for copper transport into the boiler and turbine where deposition can occur. Materials now in common use in condensers and that can be used with the invention include Admiralty metal (70 to 73% Cu, 0.9 to 1.2% Sn, 0.07% maximum Fe and balance Zn), arsenical copper, aluminum brass, aluminum bronze, 90-10 Cu—Ni, 70-30 Cu—Ni, cold rolled carbon steel, stainless steels (e.g., 3041316), corrosion resistant stainless steels, and titanium. Though more expensive, titanium and corrosion resistant stainless steels have high corrosion resistance and reduced risk of tube leaks. These and other materials may be used for thin wall tube construction with the invention.

In one embodiment, the ferroelectric or other polarizable material is affixed to the external surface of the tubes. The electrically conductive tube serves as the first of the two electrodes, specifically as the electrical ground. The second electrode is applied to the polarizable material, as described elsewhere herein. Electrical leads are attached to both electrodes and serve the purposes and functions described elsewhere herein. In one embodiment, a layer of hydrophilic surfactant or similar substance is applied to the outer second electrode to facilitate condensation on the surface of the electrode, thereby enhancing thermal transfer between the condensing vapor and the ferroelectric layer. Such a material may enhance nucleation on the external surface of the ferroelectric layer of the condensing vapor, thereby facilitating thermal transfer from the vapor to the ferroelectric during cycling.

Figure 26:
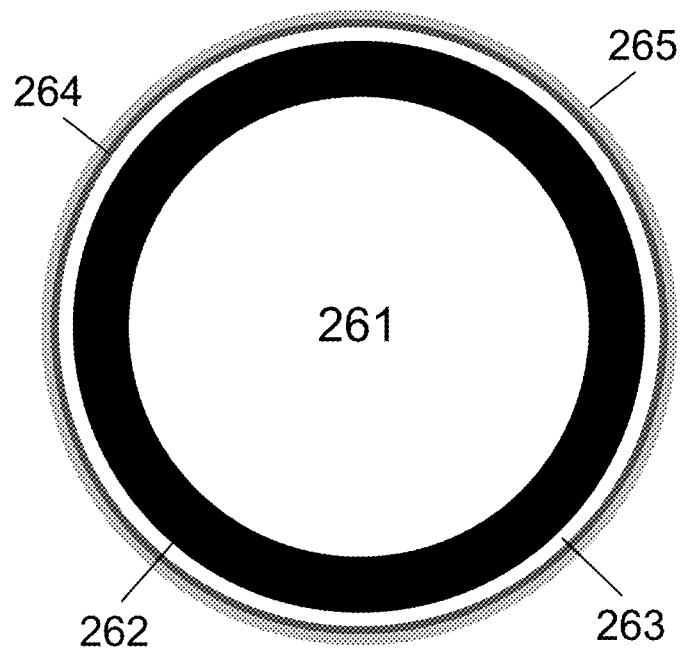
FIG. 26 is a schematic of a cross-section of a condenser tube that may be used in one embodiment wherein the ferroelectric generator is incorporated directly into the condenser. In this example, the latent heat released during condensation of the vapor is input directly into the ferroelectric without an intermediate heat exchanger. Condensation occurs at or near the surface of the ferroelectric material. The ferroelectric is cooled by the circ water that flows through the condenser tubes.

A cross section of a condenser tube in one embodiment is shown schematically in FIG. 26, which is not drawn to scale overall or in the relative thicknesses of the several features and layers depicted. As illustrated in FIG. 26, a cooling fluid 261 passes through the tube 262 and removes heat from the ferroelectric layer 263. The conducting wall of the tube 262 is electrically grounded (not shown). A layer of ferroelectric or other polarizable material 263 is affixed to the surface of the thermally and electrically conducting tube so as to maximize thermal conduction from one to the other and to permit the induction of screening charges on the tube wall by the bound surface charge of the polarized layer 263. A second electrode 264 is affixed to the surface of the layer of polarizable material 263. Leads are attached to both electrodes and used as described herein during cycling. In one embodiment, a surface coating with a hydrophilic surfactant 265 is applied to the second electrode 264 to facilitate and expedite transfer to the ferroelectric layer of the heat released during condensation of the vapor, which enters the condensation chamber when the valve (not shown) thereto is open and comes into direct contact with the outermost layer of the tube as constructed. The surface coating 265 may also provide a seal for the ferroelectric layer and the second conductor to prevent an electrical short in the system.

In one embodiment, the tubes may include thermally and electrically conductive fins or similar features on the outside of the tubes to enhance thermal transfer from the vapor as it condenses, in which event the ferroelectric layer, the second electrode, and any additional hydrophilic surfactant or other coating used, would also attach to those features. In yet another embodiment, thermally conductive fins or similar features may be included within the inside of the tubes to enhance thermal transfer between the cooling fluid and the ferroelectric material.

The ferroelectric generator in these embodiments and others operates as described below. Thermal and electrical cycling under computer control with a control circuit is conducted as described herein. In these embodiments, the fluid that inputs heat into the ferroelectric during the appropriate steps of the thermodynamic cycle (steps AB and BC in the exemplary thermodynamic cycle described below) is the condensing vapor, and the cooling fluid that removes heat (during steps CD and DA) is the cooling circ water, for example, that flows through the condenser tubes, or another cooling fluid.

Cycling is accomplished in this implementation by alternately subjecting the ferroelectric enveloped tubes to the vapor at $T_H$ to input heat into the material, and then withdrawing heat from the material by the passage of cooling fluid at $T_L$ through the tubes. In one embodiment, this is accomplished by subdividing the overall condenser chamber into two or more sections. The exhaust steam or other vapor fed to the condenser is alternately directed, through one or more valves, to one section of the chamber. When that chamber is filled with vapor at approximately the pressure of the vapor supply source (e.g., the exhaust pressure of a turbine), the valve is closed and the vapor supply is directed to another of a plurality of condenser chambers. When a chamber has been filled with vapor, heat is transferred to the ferroelectric as the vapor condenses. Heat is then removed from the ferroelectric by, for example, the cooling fluid in the tube, the steam or other vapor chamber having been closed. The ferroelectric, under direction of a control circuit, is cycled electrically in conjunction with the input and withdrawal of heat during this process in accordance with one of the cycles described herein. The control circuit also synchronizes the valves that direct vapor to particular condenser chambers with the thermal cycling of the ferroelectric that is part of the condenser tubes. The pressure in the condenser chamber decreases as a result of the vapor condensing, facilitating the rapid input of vapor into the chamber when the valve is reopened. As the vapor condenses, it falls into the hotwell, or water box, and is collected and used as with an ordinary condenser.

The invention can be used without subdividing the condenser chamber by closing off the transmission of steam when the valve is closed. Since the back pressure of the steam could vary materially while the valve is closed, however, it may generally be preferable to use a multi-chamber configuration with two or more subdivided condenser chambers as described herein. If it is desirable that the upstream source of vapor to the condenser experiences little variation in back pressure, a plurality of subdivided condenser chambers can be used so that vapor continuously enters the condenser, and upstream vapor pressures will remain constant as with a traditional condenser.

The ferroelectric material is thus thermally and electrically cycled as described herein, and it operates and is controlled by a control circuit as described herein in order to generate electricity from the thermal energy removed from the condensing vapor. Steam does not cause electrical shorting when it is in contact with the exterior electrode 264. However, electrical shorting can occur from the outer electrode to the grounded metals of the condenser, and electrical insulation may be applied in one embodiment at the outer edges of the second electrode if they are in immediate proximity to a metal ground. The electrical leads may also be insulated to prevent shorting. The exemplary embodiments presented here are only illustrative of the invention, which is general and is intended to be used in many other configurations that permit the heat released during vapor condensation to directly input heat into the ferroelectric materials as in the illustrative embodiments.

The conversion of thermal energy to electricity. FIG. 1 is a representative depiction of the basic elements of a heat to electric conversion apparatus. Referring to FIG. 1, a single-stage ferroelectric conversion device/apparatus 100 that utilizes the change in spontaneous polarization that occurs from temperature cycling to generate electric charges that are discharged to an external circuitry at high voltage is schematically shown according to one embodiment of the present invention. The apparatus 100 includes a ferroelectric layer 110 having a first surface 112 and an opposite, second surface 114. The ferroelectric layer 110 consists of a ferroelectric material that is characterized by a phase transition temperature at which the material undergoes a phase change from the ferroelectric phase to either the paraelectric or antiferroelectric phase and back again as the temperature change is reversed. The ferroelectric layer 110 may consist of a ferroelectric material that is characterized with a Curie temperature, $T_c$, such that when the temperature of the ferroelectric material is lower than the Curie temperature $T_c$, the ferroelectric material is in a ferroelectric phase in which spontaneous polarization is established in the unit cells of the ferroelectric material, and when the temperature of the ferroelectric material is greater than the Curie temperature, $T_c$, spontaneous polarization is not established in the unit cells of the ferroelectric material or is negligible. The ferroelectric layer 110 may also consist of a ferroelectric material that undergoes phase transition from ferroelectric to paraelectric as the temperature of the ferroelectric material decreases below the transition temperature. The ferroelectric layer 110 may also consist of a ferroelectric material that undergoes phase transition from the ferroelectric phase to the antiferroelectric phase at a phase transition temperature, such material changing back to the ferroelectric phase when the temperature change is reversed. The ferroelectric layer 110 has a thickness defined between the first surface 112 and the second surface 114. The thickness required in practice depends upon several parameters including the particular application and the characteristics and amount of heat available to be converted to electricity; the particular ferroelectric material utilized; and the thermal conductivity of the ferroelectric material. Typically, the thickness of the ferroelectric layer 110 in one stage of the apparatus 100 is between about 0.01 mm and about 1 cm. Other values of the thickness can also be utilized to practice the invention. The ferroelectric layer 110 may be planar in shape or of any other shape, its configuration being limited only by manufacturing technology and operational considerations for the device. In certain embodiments of the invention, for example, the polarizable material is affixed to the external circumference of the condenser tubes in a shell and tube surface condenser, thus having a more or less tubular shape, as further described herein.

The width, length, and shape of the ferroelectric layer 110 is determined by the nature of the ferroelectric material, the particular application, the characteristics and amount of heat available to be converted to electricity, the heat transfer mechanism, and other factors. There is no theoretical limit on the width and length of the ferroelectric layer 110. Limitations are practical manufacturing limitations that may exist from time to time for a particular ferroelectric material and operational factors of a particular application. Where the width and length of the ferroelectric layer 110 is limited by practical considerations, a number of similar or identical devices can be arranged in an array or in a stack to effectively expand the surface available for communication with the heat exchangers that interface the device depicted in FIG. 1 with the heat source and heat sink. In such an application, the conductive leads from the electrodes may be joined to electrical buses, and the cumulative array would then act as a larger device having an area approximately equal to the total area of the individual devices, thereby permitting generation of electric power limited only by the quantity and character of the available thermal energy. One example of such an array is illustrated by FIG. 8.

A pair of electrodes 122 and 124 is respectively positioned on the first surface 112 and the second surface 114 of the ferroelectric layer 110. The electrodes 122 and 124 consist of a thermally and electrically conductive material. Such electrodes 122 and 124 are substantially in contact with the first and second surfaces 112 and 114 of the ferroelectric material/layer 110 so as to provide electrical contact and maximize thermal conductivity. The pair of electrodes 122 and 124 may be comprised of, for example, a thin coating of silver of a thickness sufficient to permit the conduction of the current that is generated, but sufficiently thin to minimize interference with thermal conductivity between the heat exchangers and the ferroelectric material. The thickness of the silver electrodes can be about 1-5 microns, for example. In some embodiments, it may be desirable to have the electrode set back slightly from the edges of the ferroelectric layer 110 by, for example, 1 mm, to avoid electrical discharge around the edge of the ferroelectric layer 110.

Additionally, the apparatus 100 includes means positioned in relation to the pair of electrodes 122 and 124 for alternately delivering 140 heat to and from the first surface 112 and the second surface 114 of the ferroelectric layer 110 so as to alternately cool the ferroelectric layer 110 at a first temperature $T_L$ that is lower than the transition temperature, and heat the ferroelectric layer 110 at a second temperature $T_H$ that is higher than the transition temperature, so that the ferroelectric material of the ferroelectric layer 110 thereby undergoes, with temperature cycling, alternating phase transitions between (1) the ferroelectric phase and (2) the paraelectric or antiferroelectric phase. In this exemplary embodiment, the delivering means comprises two heat exchangers 132 and 134 in fluid communication with a heat source and a heat sink (not shown) for inputting heat from the heat source to the ferroelectric layer 110 so as to heat the ferroelectric layer 110 at the second temperature $T_H$, and withdrawing heat from the ferroelectric layer 110 to the heat sink so as to cool the ferroelectric layer 110 at the first temperature $T_L$. This absorption and rejection of thermal energy is integral to satisfying the Second Law of Thermodynamics, which permits conversion of thermal energy to another form of energy, or to work, only through a process of heat absorption and heat rejection.

The apparatus 100 also has a pair of electric leads 152 and 154 electrically connected to the pair of electrodes 122 and 124, respectively. In various embodiments, the leads may be configured to one or more external loads, to an external DC source, or configured to create an open circuit, or a switch can permit switching between one or more such configurations by a control circuit acting in accordance with one of the electrical-thermodynamic cycles that can be used with the invention. Poling the domains of the ferroelectric material enables a very large overall net spontaneous polarization to develop in the ferroelectric layer as it transitions from a metastable state to a stable ferroelectric state. That overall net spontaneous polarization in turn induces very dense electrically-opposite screening charges respectively on the pair of electrodes 122 and 124. In some embodiments, the poling field may be provided by an external DC voltage applied during each cycle, as for example in U.S. patent application Ser. No. 12/465,924. In other embodiments, the poling field is established by a residual charge on the electrodes that remains after the electrical discharge step of the cycle, as for example, in U.S. patent application Ser. No. 13/228,051. While an external DC voltage is not required during cycling when poling is achieved by a field produced by residual charges on the electrodes, a DC voltage source should still be available to establish a poling field for the initial cycle and in the event the residual charge diminishes during operation below what is required for poling.

In one embodiment, as for example in U.S. patent application Ser. No. 13/226,799, the circuit is opened while the ferroelectric material of the ferroelectric layer 110 is heated to temperature $T_H$ through the addition of heat to the lattice, while total polarization remains constant at $P_H$ because the circuit is open so as to prevent discharge of the charges on the electrodes. The circuit is then closed while heat is added to the ferroelectric layer isothermally, causing the electrically-opposite screening charges to discharge to the pair of electric leads 152 and 154 at a very high voltage. The pair of electric leads 152 and 154 permits the conduction of the discharge current from the electrodes to whatever external load may be used or to busses to collect and distribute the electricity generated by multiple devices. When poling is achieved by a field resulting from the residual unscreened charges on the electrodes, an external applied voltage is not needed between the pair of electric leads 152 and 154, other than during the first cycle and for incidental use in subsequent operation, as described herein.

Figure 19:
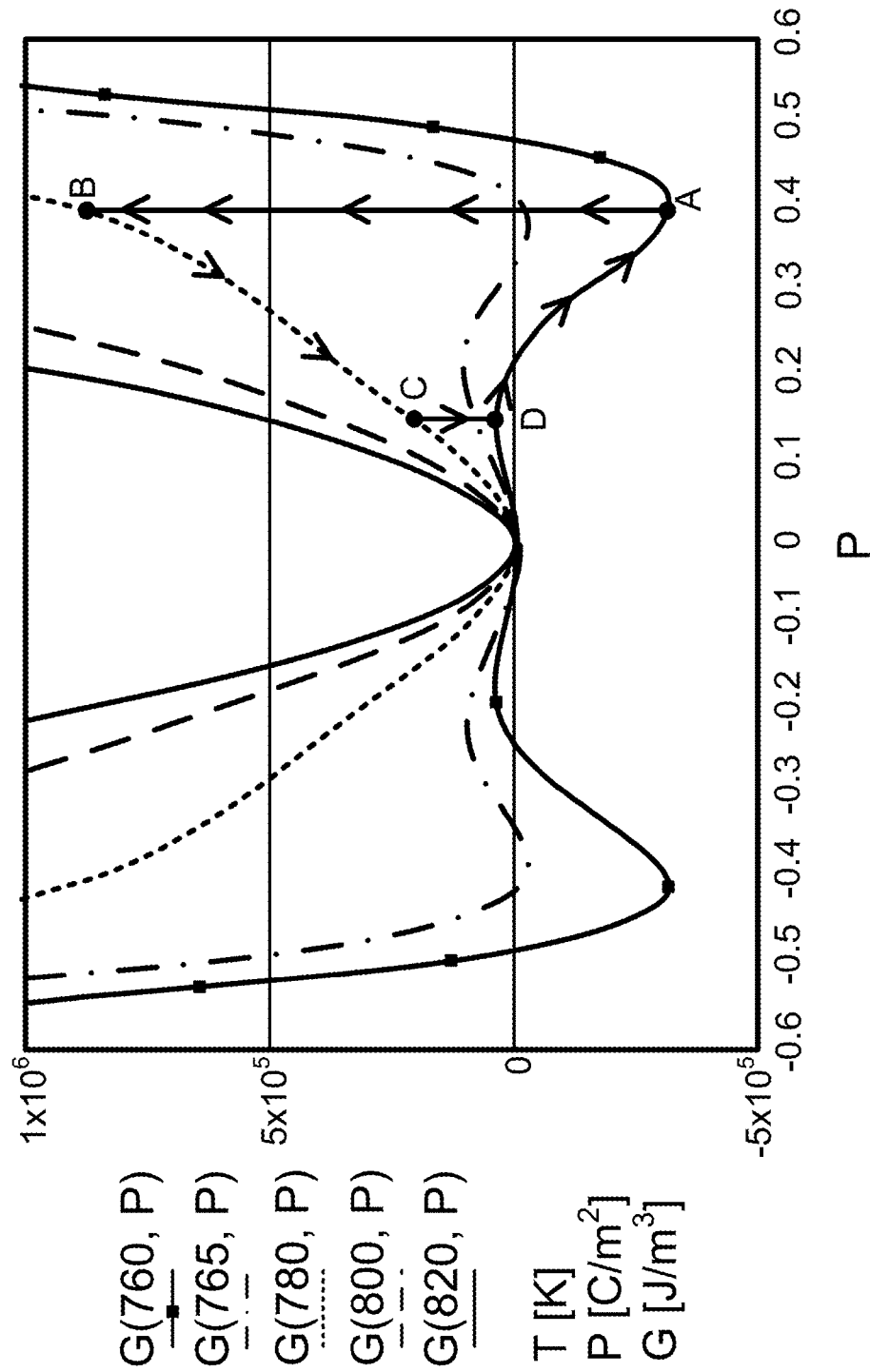
FIG. 19 is a plot of free energy for various temperature values as a function of polarization. Superimposed on the plot are the steps of a thermodynamic cycle that can be used with the invention. This cycle provides for poling by an internally generated poling field. During the electrical discharge step of the cycle, BC, sufficient charge is retained to pole during the next cycle. The value of P$_L$ is determined by the value of P that occurs at the local free energy maximum for the cycle.
Figure 20:
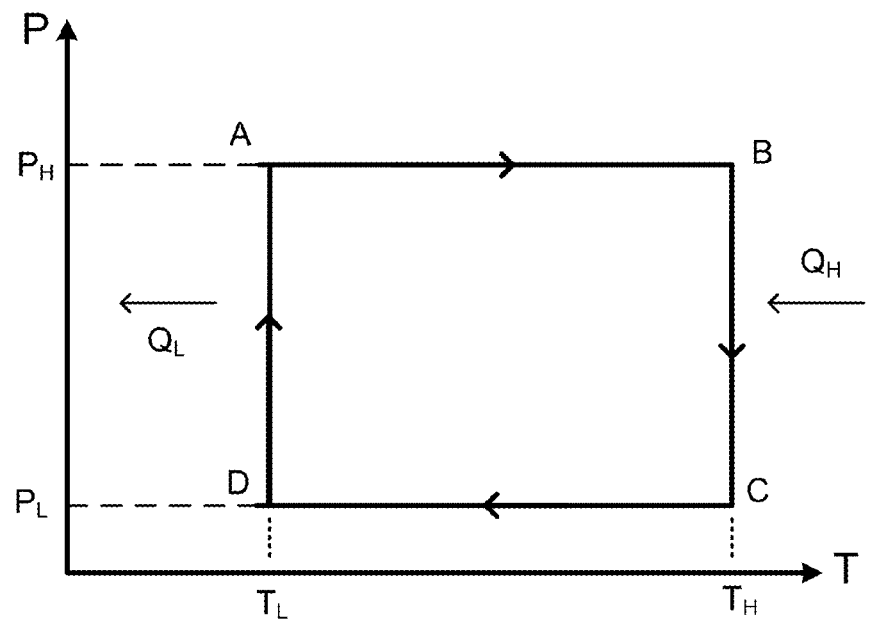
FIG. 20 is an illustration of a thermodynamic cycle of a ferroelectric wherein two steps are isothermal and two are iso-polarization. Q$_L$ and Q$_H$ indicate the removal and addition of heat, respectively, during the isothermal steps.
Figure 21:
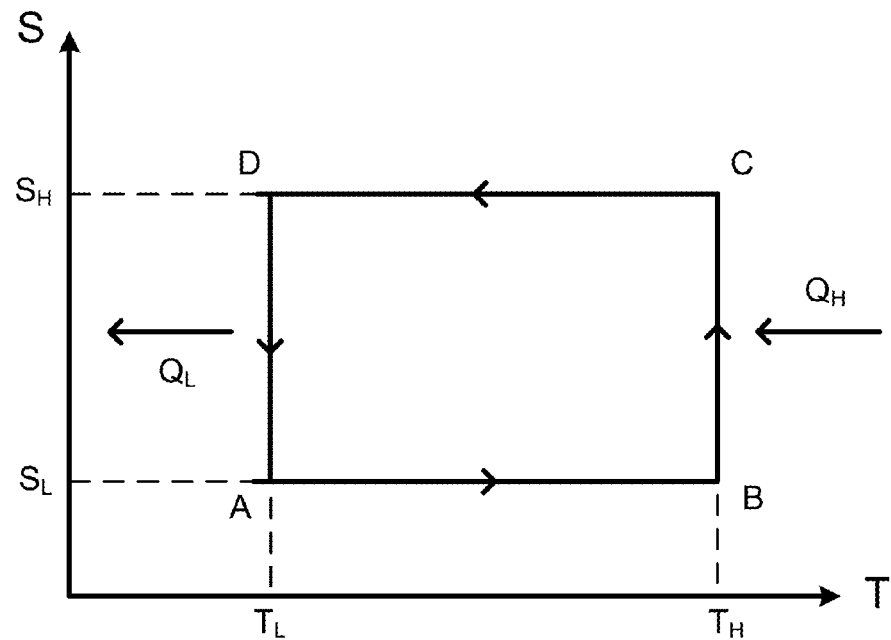
FIG. 21 illustrates entropy as a function of temperature for the cycle depicted in FIG. 20. Only the polarization contribution to free energy is considered. Other degrees of freedom, such as lattice heat and polymer backbones, are disregarded.

When poling is achieved using residual charges on the electrodes 122 and 124, a current will flow during that step between the electrodes in response to the change in net spontaneous polarization that occurs in the ferroelectric layer. That current can be exploited as an additional source of electrical energy output to the external load. This energy output during relaxation of the system from a metastable to a stable state is depicted by the downhill relaxation between points D and A in the free energy plot of the $T_L$ isotherm shown in FIG. 19. This occurs at $T_L$ as $Q_L$ is being removed from the ferroelectric layer. In one embodiment, the direction of the current during the DA portion of the cycle can be made to coincide with the direction of the current during the primary discharge (step BC as depicted in FIGS. 20 and 21 and described elsewhere) by causing the current during the DA step to pass through a full-wave rectifier (not shown) that is included in the circuit when the switch S1 is in position B in FIG. 6. Such a rectifier may, for example, be a bridge circuit. The rectifier causes current flows to and from the electrodes 822 and 824 to have the same direction at the load RL whether the current occurs during the BC or DA steps of the cycle.

Figure 2:
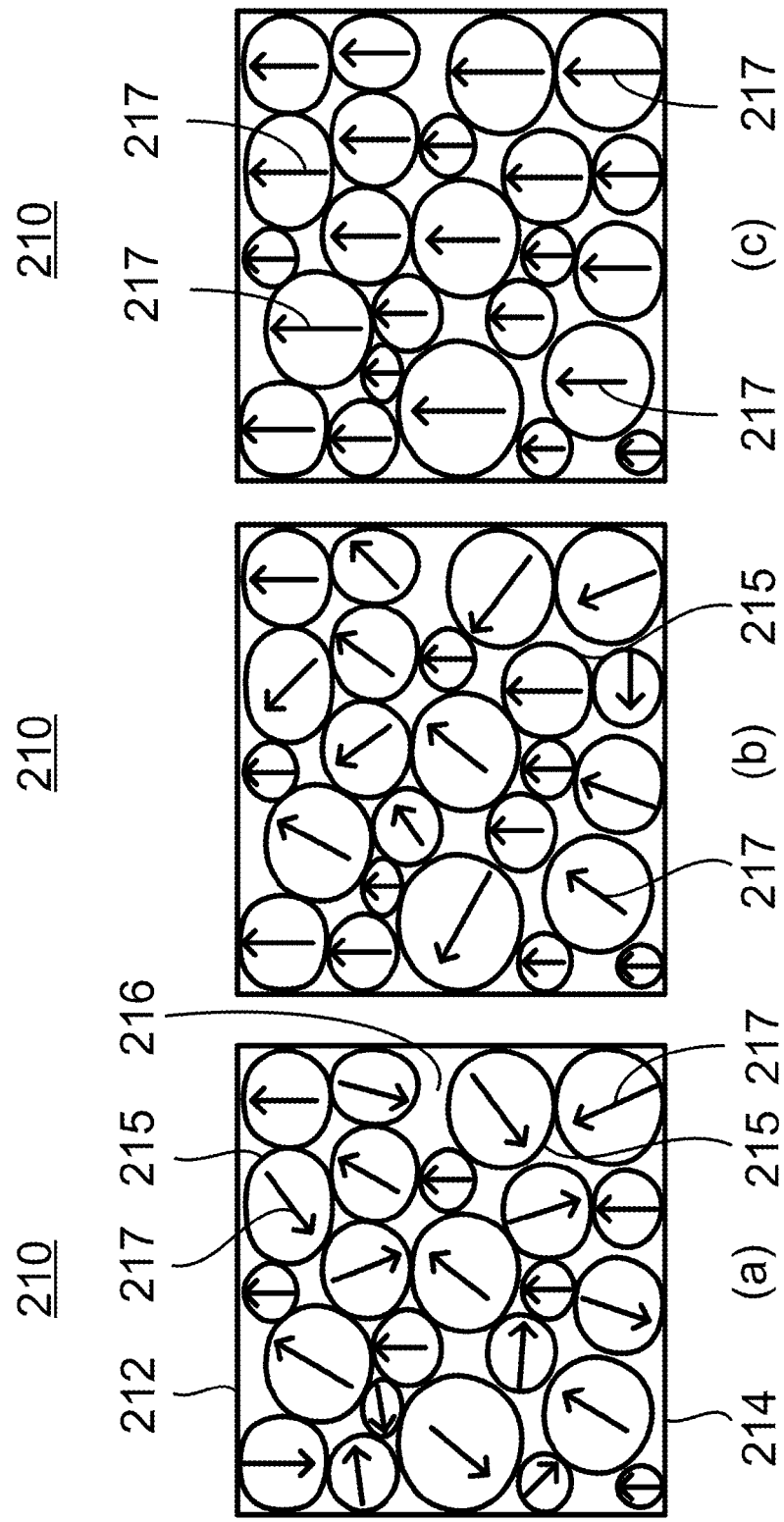
FIG. 2 illustrates schematically the alignment of the domains in a ferroelectric where (a) illustrates unpoled, random orientation, with each domain consisting of a large number of electric dipoles that would be similarly oriented within that individual domain; (b) illustrates a substantially poled material where the dipoles are oriented in the same overall direction; and (c) illustrates an ideal, completely poled ferroelectric that is generally attained only under special-conditions pertaining to the atomic and molecular structure of the material.

FIG. 2 shows schematically the alignment of the domains 215 in a ferroelectric 210 in the ferroelectric phase, i.e., the temperature of the ferroelectric 210 is lower than the Curie temperature $T_c$ of the ferroelectric 210. The ferroelectric 210 has a first surface 212 and an opposite, second surface 214 defining a ferroelectric layer body 216 there between. The ferroelectric layer body 216 is characterized with a plurality of domains 215 having a large number of polarizable units. As shown in FIG. 2(*a*), each domain 215 is characterized by a spontaneous polarization indicated by a dipole arrow 217, but randomly oriented so that there is no overall net spontaneous polarization in the ferroelectric 210. FIG. 2(*b*) shows the dipoles 217 aligned towards the same overall direction, so that a very powerful net spontaneous polarization exists in the ferroelectric 210. Such alignment can be achieved by applying a poling field to the ferroelectric layer body 216. FIG. 2(*c*) illustrates an ideally aligned ferroelectric that generally is attained only under special conditions pertaining to the crystal or molecular structure of the material.

The electrical energy that can be extracted by exploiting changes in spontaneous polarization during thermal cycling of a given ferroelectric can be calculated from the Landau phenomenological model of material systems in and around phase change. Such modeling is a more comprehensive thermodynamic representation of the system than traditional quasi-static thermodynamic analysis. The latter is effectively restricted to equilibrium conditions, whereas Landau modeling is a broader dynamic representation that includes non-equilibrium conditions, such as relaxation from a metastable state towards a more stable state pursuant to the Landau-Khalatnikov equation. For ordinary ferroelectrics, the Landau-Ginzburg-Devonshire free energy functional expresses the free energy of a ferroelectric material system in terms of the independent parameters temperature, T, and the order parameter, P, which represents the total polarization produced by the dipoles in the system, both spontaneous and induced if there is an electric field. An electric field may be due to the application of an extrinsic potential across the electrodes or it may be due to the unscreened charges on the electrodes. The Landau-Ginzburg-Devonshire free energy functional is expressed as:

$$G(T,P) = \alpha_1(T) \cdot P^2 + \alpha_{11} \cdot P^4 + \alpha_{111} \cdot P^6$$

where G is the free energy functional. G is in units of J/m$^3$, and P is in units of C/m$^2$. Polarization is a full thermodynamic variable, and it represents the full polar system described by G(T, P). The α parameters are specific to a given material system, and for those given parameters, the Landau-Ginzburg-Devonshire free energy functional provides the full information for the thermal cycles of a ferroelectric material system through and around phase transition, and for polarizable polymer systems through and around their depolarization transitions.

Figure 14:
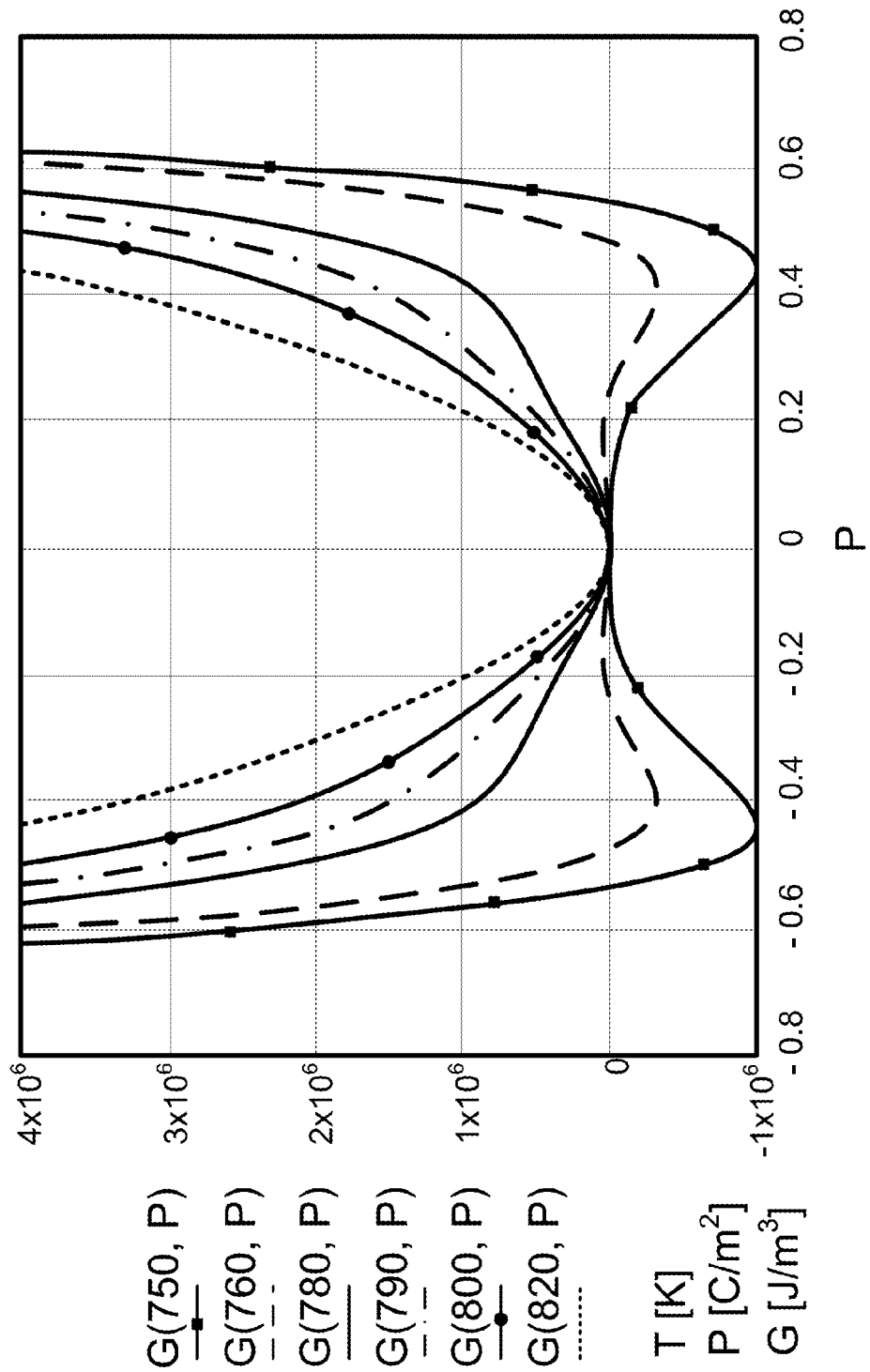
FIG. 14 is a plot of the free energy functional in terms of temperature, T, and polarization, P, using parameters for a sample of lead titanate, $PbTiO_3$. G is the Gibbs free energy. Temperature is measured in Kelvin; polarization in $C/m^2$; and the free energy, G, in $J/m^3$. Polarization is a full thermodynamic variable, and it represents the full polar system described by G(T, P).

FIG. 14 is an example of plots of the free energy functional in terms of temperature, T, and polarization, P, with the material parameters representative of a sample of lead titanate, PbTiO$_3$, with $T_c \cong 766$ K. The individual plots are for various temperatures of the material. G is assigned the value of 0 when the material is in a nonpolar state (i.e., where P=0). The free energy, G, is then plotted as calculated from the Landau-Ginzburg-Devonshire functional for various temperature values from 750 K to 820 K. For temperatures above the transition temperature, the free energy is never below the reference value assigned for the material in the paraelectric state. The global minima in the various plots represent equilibrium states.

Where a material is in its ferroelectric phase, the system will have two free energy minima, one at each of the low points of the two wells. Each of those equilibrium points is equally likely in the absence of a field, and the decrease in free energy is the same in both wells because the material system is symmetrical. By poling the dipoles as the material system enters the ferroelectric phase, the system is biased so that the system will drop down into the particular well that corresponds to the poled orientation. Poling does not materially affect the free energy of the system.

Figure 15:
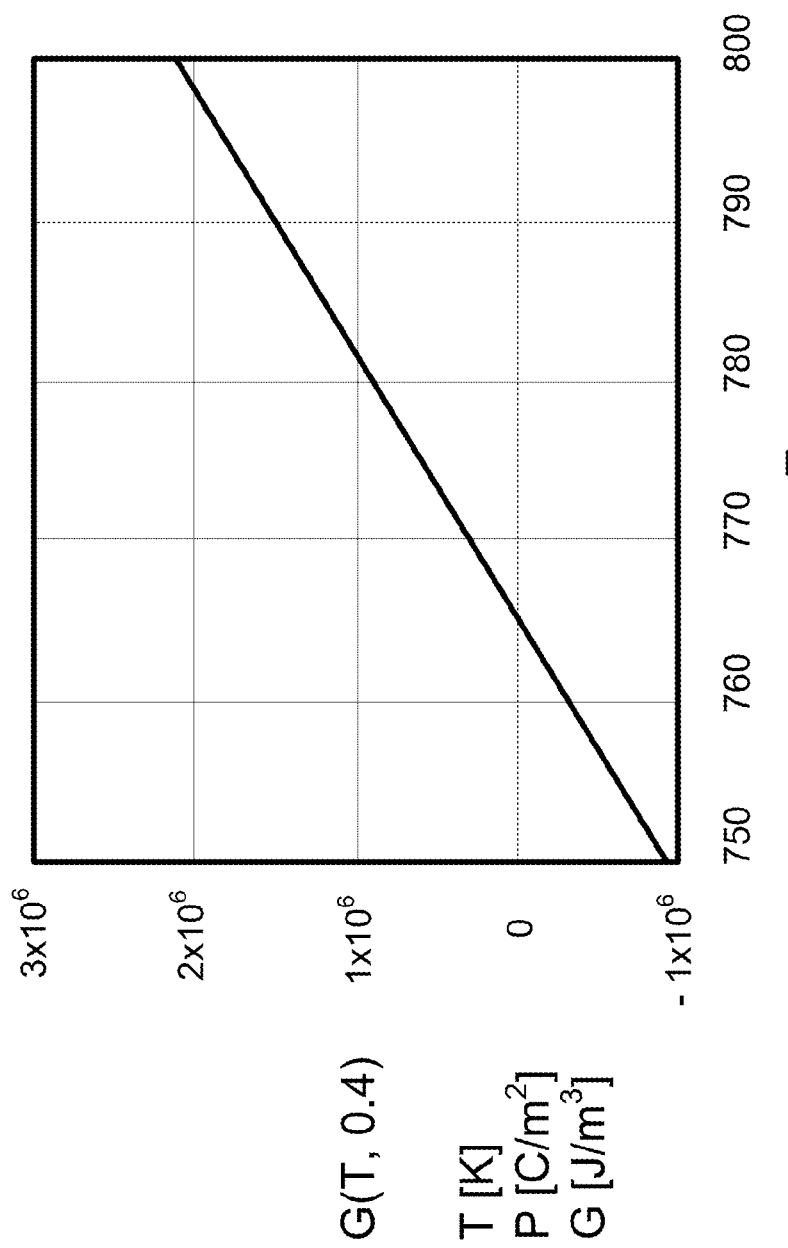
FIG. 15 is a plot of free energy as a function of temperature for a sample of lead titanate, $PbTiO_3$. Polarization is constant at $P=0.4$ $C/m^2$.

FIG. 15 is a plot of free energy as a function of temperature where polarization is held constant at 0.4 C/m$^2$. Again, the parameters used in plotting the free energy functional are those characteristic of a sample of lead titanate with $T_c \cong 766$ K. This linear relationship between free energy and temperature can be a consideration in determining the appropriate thermodynamic cycling of the ferroelectric material used in the invention. FIG. 15 indicates that it may be desirable in some instances to cycle the ferroelectric over a wide temperature range since the change in free energy increases as the temperature range of the cycle increases. Ideally, this can be performed as a perfect Carnot engine providing the highest possible efficiency. The thermal efficiency realized by cycling over the wider temperature range may decrease, however, because of increased lattice heat contribution for the wider temperature cycling if perfect regeneration cannot be performed. It should also be recognized that the accuracy of the Landau-Ginzburg-Devonshire model generally decreases as temperature departs farther from the phase change temperature, so the linear relationship may not be as accurate over large temperature ranges.

Figure 16:
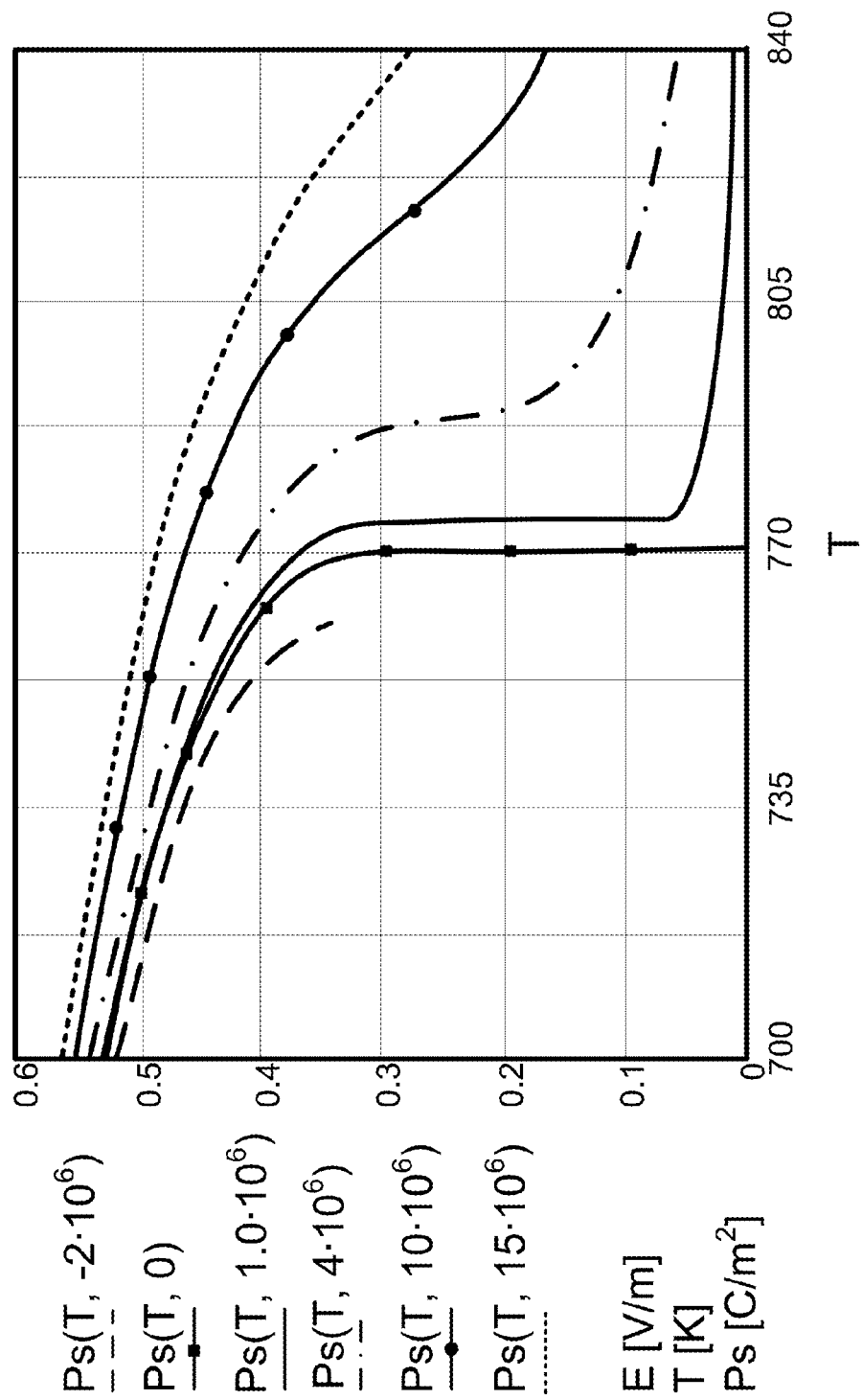
FIG. 16 is a plot of polarization at various electric field values, E. Temperature is measured in Kelvin, and the E field value is in volts per meter.

FIG. 16 presents plots of spontaneous polarization versus temperature for various electric field values for the same lead titanate parameters. The relationship between E; free energy, G; P; and T, is derived from the free energy functional and can be expressed as:

$$E = \partial G / \partial P = 2\alpha_1(T)P + 4\alpha_{11}P^3 + 6\alpha_{111}P^5.$$

With the present invention, the E values represent the field generated by the unscreened charges on the electrodes. The electric field value E can also include a small poling field applied from a DC voltage source in the event an external poling field is applied.

Figure 17:
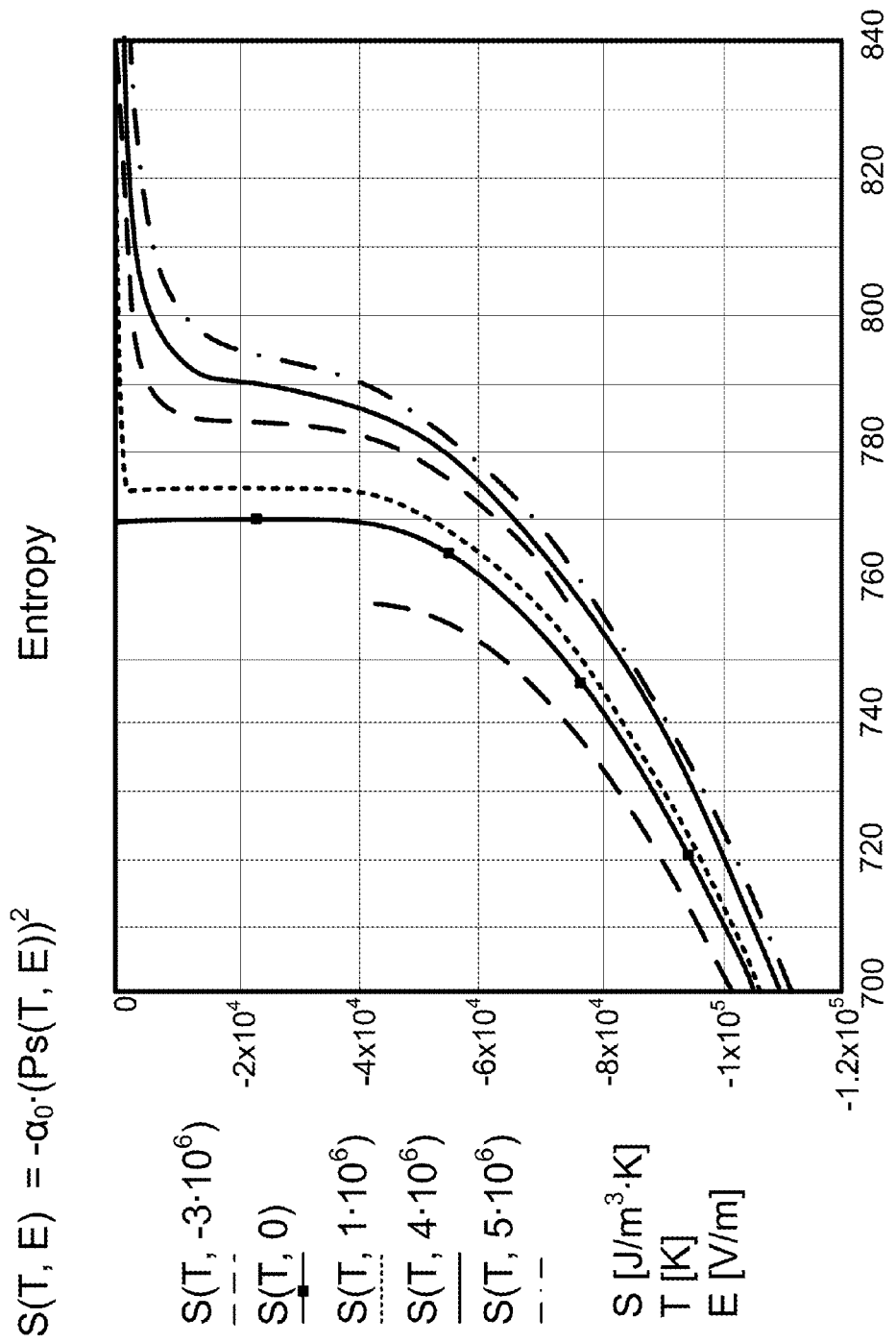
FIG. 17 is a plot of entropy for a sample of lead titanate, PbTiO$_3$, as a function of temperature for various E field values. Temperature is measured in K, and entropy is measured in units of J/m$^3$·K.

FIG. 17 is a plot of entropy, S, as a function of temperature for various E values where the parameter E is measured in volts per meter. Entropy is proportional to P$^2$, and $$S = -\alpha_0 \cdot [P_S(T,E)]^2$$

where entropy is measured in J/(m$^3$·K). The parameter $\alpha_0$ is related to the material parameters by the expression $$\alpha_1 = \alpha_0(T - T_0),$$

where $T_0$ is the Curie-Weiss temperature, which is the phase transition temperature for materials that have second order phase transitions, but has a different value for first order transition materials.

The invention can be practiced pursuant to various thermodynamic-electrical cycles, and the examples of cycles herein is illustrative only and in no way limits the scope and meaning of the invention. An example of one such thermodynamic cycle that can be used with the present invention is depicted in FIG. 20 in an ideal form. It has two isothermal steps, BC and DA, and two steps where polarization is held constant, AB and CD. The specific operation of this cycle is described in more detail herein.

In some thermodynamic cycles, the discharge of the electrodes to an external load during the course of the cycle may be complete or nearly complete. With other cycles, the discharge of the electrodes is not complete. Instead, a small unscreened residual charge is left remaining on the electrodes before discharge is complete, and that residual charge serves to pole the material during the next cycle. Other than as necessary to provide a poling field, it is generally desirable to allow for removal of the charges from the electrodes so as to maximize the amount of electrical energy withdrawn during that step of the cycle. The amount of the residual charge left remaining, corresponding to $P_L$, that is sufficient to establish a field to pole the spontaneous electric dipoles during transition into the ferroelectric phase will depend on the material system, the configuration of the ferroelectric layer, and other factors. The impedances of the system and the load must be matched so that the depolarization field does not exceed the coercive field at any time after the external poling field is turned off. The value of $P_L$ is determined by the value of P that occurs at the local free energy maximum for the cycle. In one embodiment using an exemplary cycle described herein, that local free energy maximum is depicted as point D on the free energy isotherm in FIG. 19. By way of example, for a ferroelectric sample of $PbTiO_3$, $P_L \cong 0.15$ $C/m^2$ generally creates an adequate poling field, as indicated in FIG. 19. The invention can also be practiced by letting $P_L$ go to zero, with subsequent poling performed by applying an external field during the DA step of the cycle.

Starting at an arbitrary point C of the specific cycle illustrated by FIG. 20, the material is at a relatively high temperature, $T_H$, and in a paraelectric or antiferroelectric phase. In one embodiment, the electrodes on the surfaces of the ferroelectric have discharged at point C so that only enough residual charge remains on the electrodes to provide a field sufficient to pole the ferroelectric when it is cycled back into its ferroelectric phase. Then, during the CD step of the cycle, the ferroelectric is cooled to a relatively low temperature, $T_L$, while the electrical circuit is open so that total polarization remains constant at the minimum value, $P_L$. The heat withdrawn during the CD step corresponds to the sensible lattice heat to cool the material. During step CD, the ferroelectric material goes from point C to a metastable state at point D.

Figure 18:
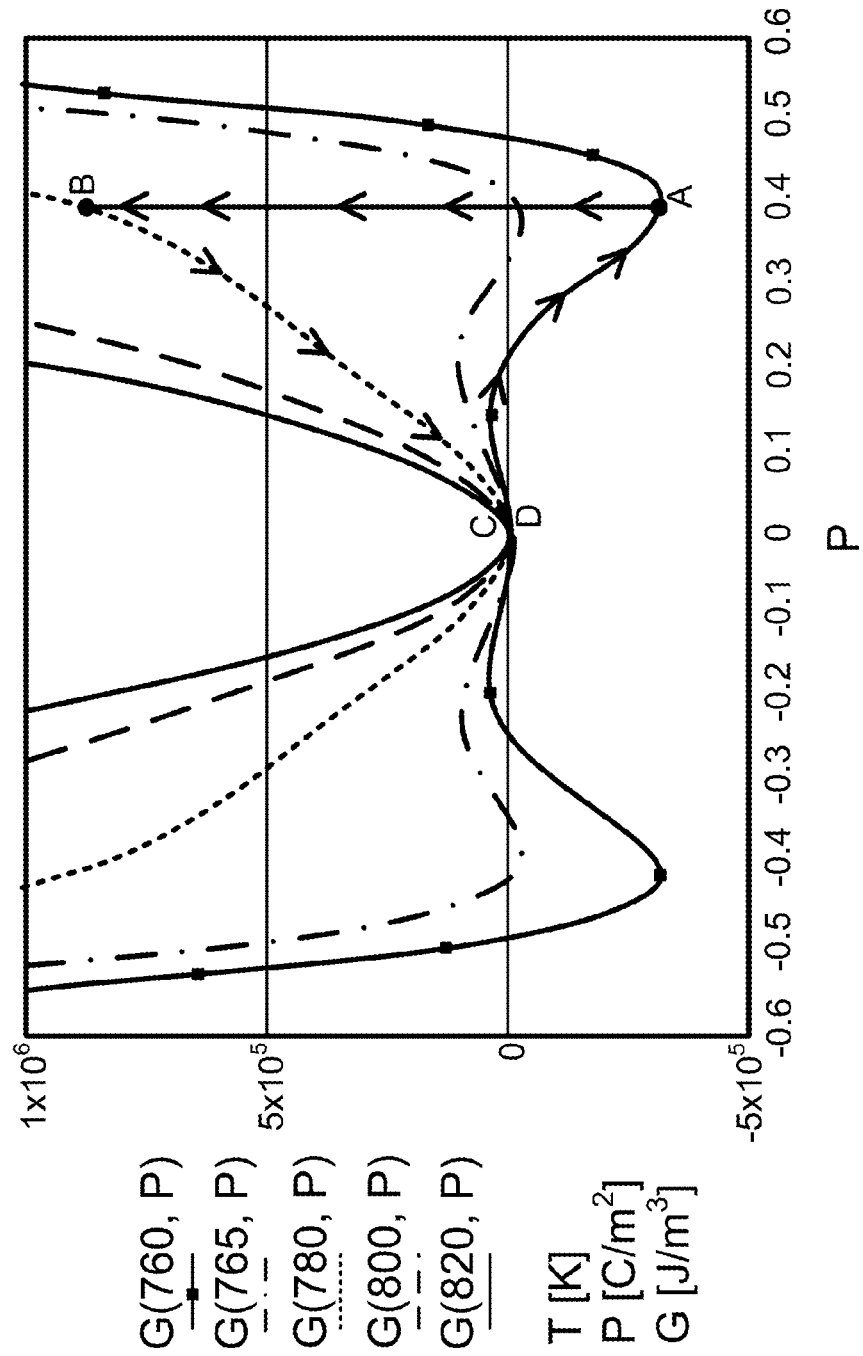
FIG. 18 is a plot of free energy for various temperature values as a function of polarization. Superimposed on the plot are the steps of one thermodynamic cycle that can be used with the present invention. Polarization is a full thermodynamic variable, and it represents the full polar system described by G(T, P).

The circuit is closed at point D of the cycle. During the DA step, heat $Q_L$ is withdrawn isothermally while the ferroelectric is at $T_L$ until the spontaneous polarization attains the maximum value, $P_H$. That value of $P_H$ may be as great as is permitted by the particular ferroelectric material system without causing electrical breakdown or significant electrical leakage through the ferroelectric layer. All other things being equal, attaining high $P_H$ values will generally correspond to larger output of electrical energy in each cycle. $P_H$ will vary depending upon the ferroelectric material system, the configuration of the ferroelectric layer and other factors. In the illustrative case of a lead titanate sample, $P_H$ may have a value of 0.4 $C/m^2$ as shown in FIGS. 18 and 19.

During the DA step, the electrical circuit is closed and a current flows from the electrode on one side of the ferroelectric to the electrode on the opposite side of the ferroelectric until screening charges develop that equal the opposing bound charges on the surfaces of the ferroelectric. Also during the DA step of the cycle, the small residual field resulting from the unscreened charges on the electrodes at point D causes the resulting dipoles to be oriented towards one direction—i.e., they are poled. In another embodiment, the poling field can be the result of an externally applied potential. The heat $Q_L$ withdrawn during the DA step corresponds to the latent heat of the phase transition. During the DA step, the material system relaxes from a metastable state at point D to a stable state at point A, as shown in FIGS. 19 and 20.

During the DA step, electric energy is generated in those embodiments where poling is done other than by an externally applied voltage. The energy so generated during step DA can be discharged into external circuitry to perform electrical work. In one embodiment, a full-wave rectifier can be utilized to rectify the current flows to and from the electrodes 822 and 824 to have the same direction at the load whether the current occurs during the BC or DA steps of the cycle. Such a full-wave rectifier may consist, for example, of a bridge circuit. As noted elsewhere, poling may also be achieved by applying an external field from a DC voltage source across the electrodes on the surfaces on the ferroelectric layer. On those occasions, electrical work is performed on the system rather than generated by the system during step DA.

In the next step of the cycle, AB, the circuit is open and the ferroelectric is heated to $T_H$ above the material transition temperature at constant polarization. At point B of the cycle, the ferroelectric is in a metastable state, and the circuit is then closed. During the BC step of the cycle, heat is input isothermally as polarization is reduced to $P_L$ and the ferroelectric relaxes from the metastable state at point B towards point C. The heat $Q_H$ added during the BC step is equal to the enthalpy change that corresponds to the change in polarization. During that step, screened charges on the electrodes become unscreened and are discharged into external circuitry to perform electrical work, total polarization at point C being reduced to $P_L$ at which point the circuit is opened to prevent further discharge.

The transitions of the material system from a stable state to a metastable state or vice versa during the several steps of the cycle are described by Landau-Khalatnikov time dependent phase transition theory, which can be used to match the response time of the load to the transition time from the metastable state.

$T_H$ and $T_L$ are above and below the transition temperature, respectively, so as to allow for phase change. Depending upon characteristics of the material, such as the homogeneity of the crystal structure, for example, $T_H$ and $T_L$ may differ from the transition temperature by a few degrees centigrade or less. $T_H$ and $T_L$ may also differ from the transition temperature by a substantial amount, for example, by 20 degrees centigrade or more. In another implementation $T_H$ and $T_L$ can both be below the transition temperature, if the material is cycled between a greater polarization value and a lesser polarization value.

It will be recognized by persons skilled in the art that the cycle illustrated in FIG. 20 depicts a cycle performing in an ideal fashion. In practice, there generally may be deviations from ideal or perfect isothermal or constant polarization steps of the cycle and deviations from perfect cycling between $P_H$ and $P_L$. It should be recognized that the invention will generally be practiced such that the actual cycling and actual poling may depart to some degree from the ideal.

In some embodiments of the invention the ferroelectric phase occurs at a temperature higher than the transition temperature, and the paraelectric phase, or antiferroelectric phase, occurs below the transition temperature. In such embodiments, the cycle depicted in FIG. 20 operates the same except in the opposite direction. The four steps are DC, CB, BA, and AD. Steps DC and BA occur at constant polarization, $P_L$ and $P_H$, respectively. Only lattice heat is input and withdrawn, respectively, during steps DC and BA. Heat $Q_H$ is input isothermally during step CB, and heat $Q_L$ is withdrawn isothermally during step AD. During step CB, the electrical circuit is closed; poling with a DC voltage or an internally generated field occurs; and a current flows from the electrode on one side of the ferroelectric to the electrode on the opposite side until screening charges develop that equal the opposing bound charges on the surfaces of the ferroelectric. The electrical circuit is closed and electricity is discharged to a load during step AD.

The robustness of a particular thermodynamic cycle can be evaluated using values calculated from the free energy functional. FIGS. 18 and 19, like FIG. 14, are examples of plots of the free energy functional in terms of temperature, T, and polarization, P, with the material parameters representative of a sample of lead titanate, $PbTiO_3$, where $T_c \cong 766$ K. The individual plots are for various temperatures of the material. FIG. 18 includes designations of the points of the cycle (A, B, C and D) depicted in FIG. 20 with two isothermal steps and two steps where polarization is constant. In FIG. 18, $P_L$ is reduced to a negligible level or zero during the course of the cycle. FIG. 19 is a similar plot of free energy for the cycle depicted in FIG. 20 with the points of the cycle designated thereon, but $P_L$ is not allowed to go to zero. Instead, during the electrical discharge step of the cycle, BC, sufficient charge is retained to pole during the next cycle. The value of $P_L$ is determined by the value of P that occurs at the local free energy maximum for the cycle, as shown on FIG. 19. The values for T and P in FIGS. 15, 18, and 19 are illustrative only and are not intended to suggest that they are ideal or unique.

FIG. 21 illustrates entropy as a function of temperature for the cycle depicted in FIG. 20. Only the polarization contribution to free energy is considered. Other possible degrees of freedom that could contribute to entropy changes, such as lattice heat and polymer backbones, are disregarded in the illustration. Where those other factors are negligible, the cycle is isentropic even in the absence of regeneration during steps AB and CD.

Figure 22:
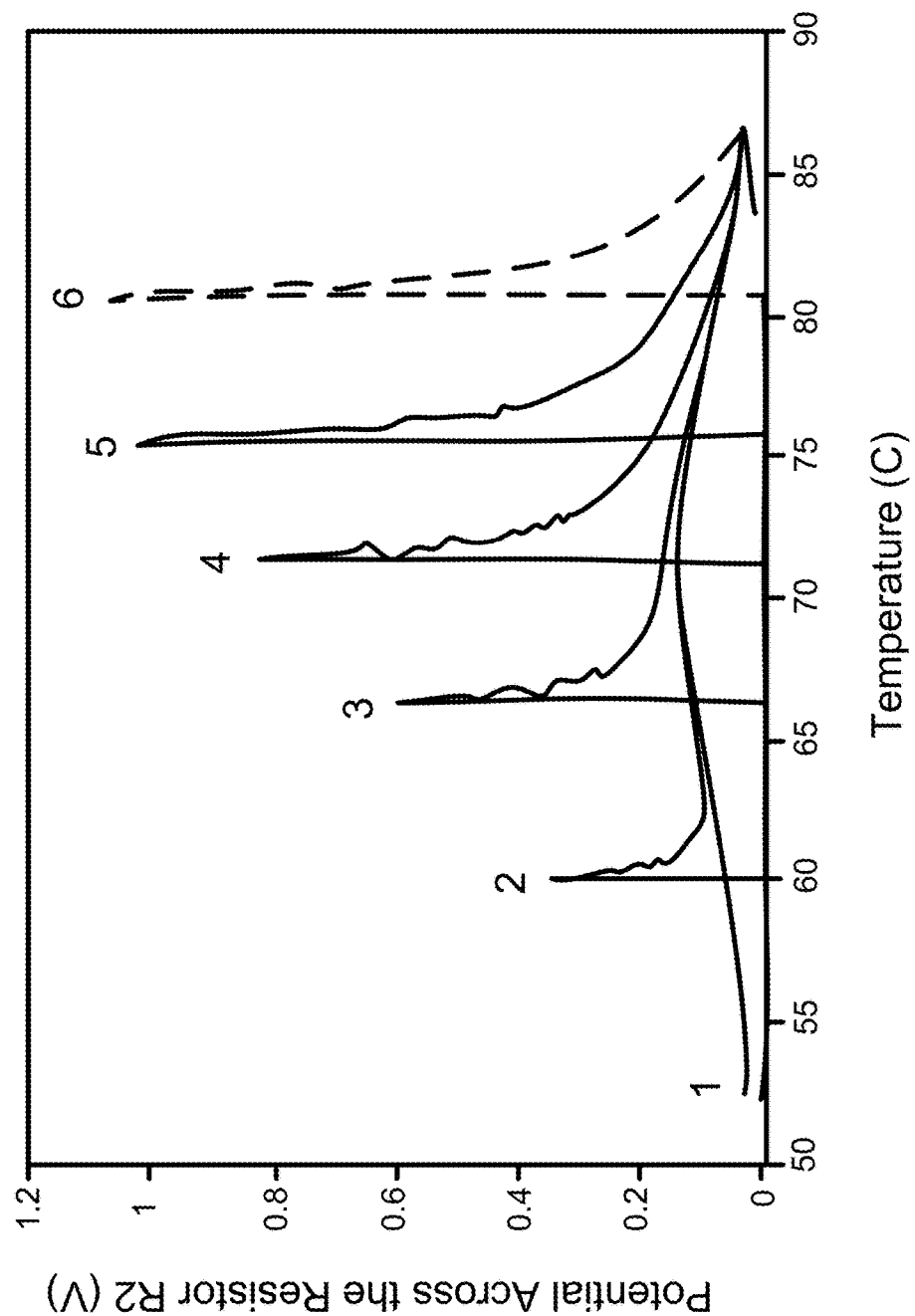
FIG. 22 shows the measured electric current generation during the heating phases, resulting from changes in the permanent polarization that correspond to different relay turn-on temperatures for a P(VDF-TrFE) copolymer film of 50 μm thickness.

FIG. 22 shows the measured electric current generated during the heating phases resulting from the change in permanent polarization that correspond to different relay turn-on temperatures for a P(VDF-TrFE) copolymer film of 50 μm thickness. The load resistor RL had a resistance of 10 MΩ, and the measure resistors R1 and R2 were chosen at 0 and 22 kΩ, respectively. The horizontal axis has been largely expanded due to the somewhat broad transition of the copolymer, which makes the original peak (line 1) look flat. Lines 2-6 in FIG. 22 show the electricity generated with increasing delay temperature (time). These lines correspond to the AB step in the thermodynamic cycle shown in FIG. 20. The electric potential (field) generated across the sample dramatically increases with larger delay temperatures, reaching about 10 times the potential attained with the original peak of line 1. The increasing potential with larger delay temperature corresponds to the enlargement of the rectangular cycle along the temperature axis at constant polarization (AB step). Thermodynamically, this leads to a larger efficiency. The integrated intensities remain largely constant, as expected.

Figure 3:
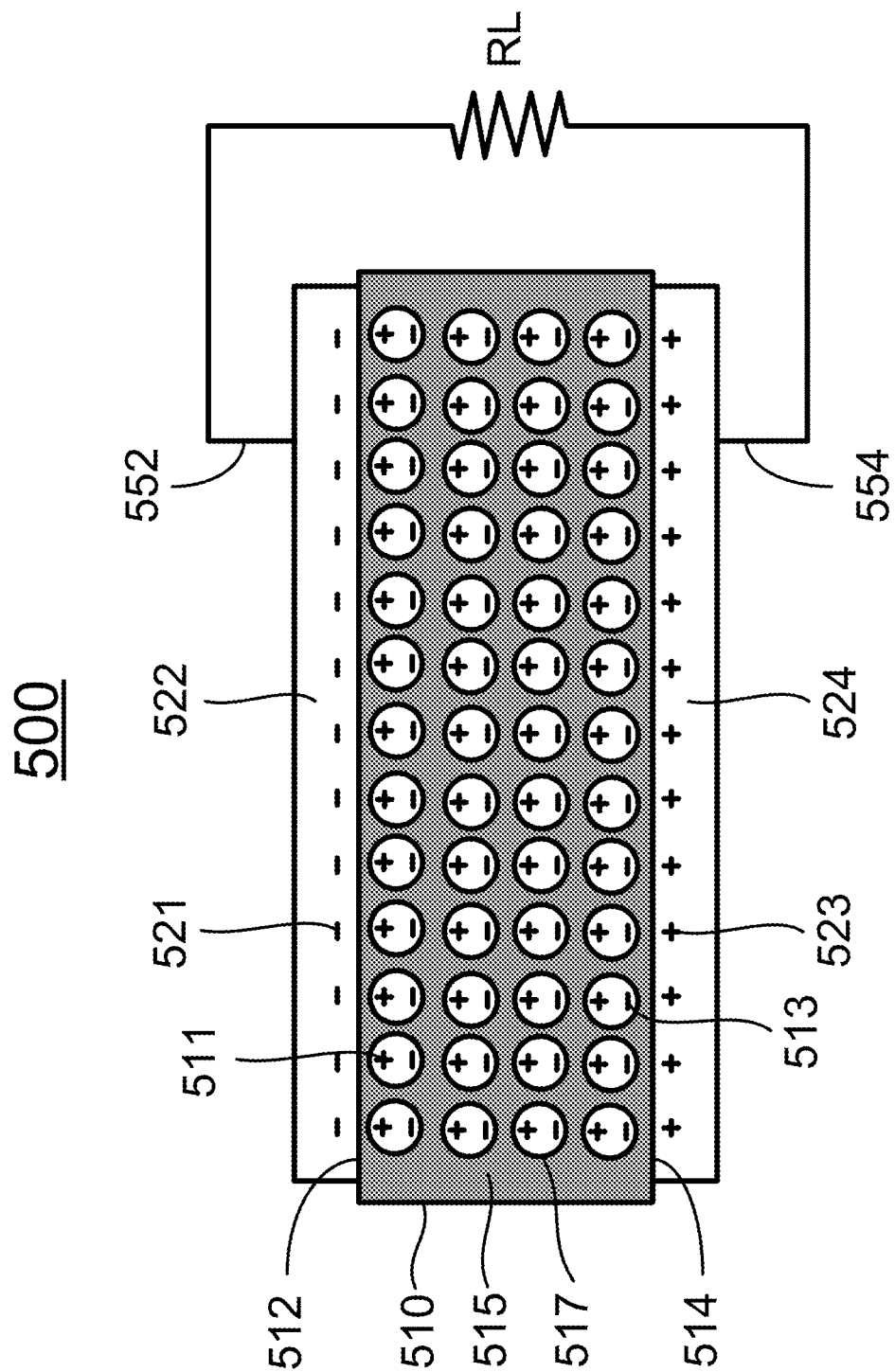
FIG. 3 illustrates schematically bound charges on the surfaces of a ferroelectric structure/layer and the opposing screening charges that are induced on the adjacent surfaces of the electrodes when there is substantial net spontaneous polarization, $P_s$, which may be denoted as $P_r$ in the absence of an external field.

FIG. 3 shows schematically a ferroelectric module 500 in the ferroelectric phase with bound surface charges generated on the surfaces of the ferroelectric layer 510 and corresponding screening charges generated on the electrodes 522 and 524. In the exemplary embodiment, the electric dipoles 517 are aligned, for example, by a small poling field, thereby enabling a large overall net spontaneous polarization to occur in the ferroelectric layer 510. The resulting large net spontaneous polarization produces very dense bound charges 511 and 513 on the surfaces 512 and 514 of the ferroelectric layer 510. As a result, a current flows to the electrodes 522 and 524. Screening charges 521 and 523 are thereby produced on the electrodes 522 and 524 that equal, but are opposite in charge to, the bound charges 511 and 513 at the surfaces 512 and 514 of the ferroelectric layer 510. At that point, the net electric field in the electrodes 522 and 524 is necessarily negligible or zero since the electrodes 522 and 524 are conductors. The bound charges 511 and 513 in the ferroelectric layer 510 result from the aligned electric dipoles 517 and $P_s$, while the screening charges 521 and 523 on the electrodes 522 and 524 result, in turn, from the bound charges 511 and 513, and are in opposition to those bound charges 511 and 513.

As the ferroelectric goes through phase transition and becomes paraelectric or antiferroelectric, the spontaneous polarization in the ferroelectric layer 510 disappears. As a result, the screening charges 521 and 523 on the electrodes 522 and 524 become unscreened at an extremely high potential difference between the electrodes 522 and 524. The exact potential difference will depend upon the particular ferroelectric and the configuration of the module, but potentials in excess of 30,000 volts may be attained with appropriate materials before dielectric breakdown.

Figure 4:
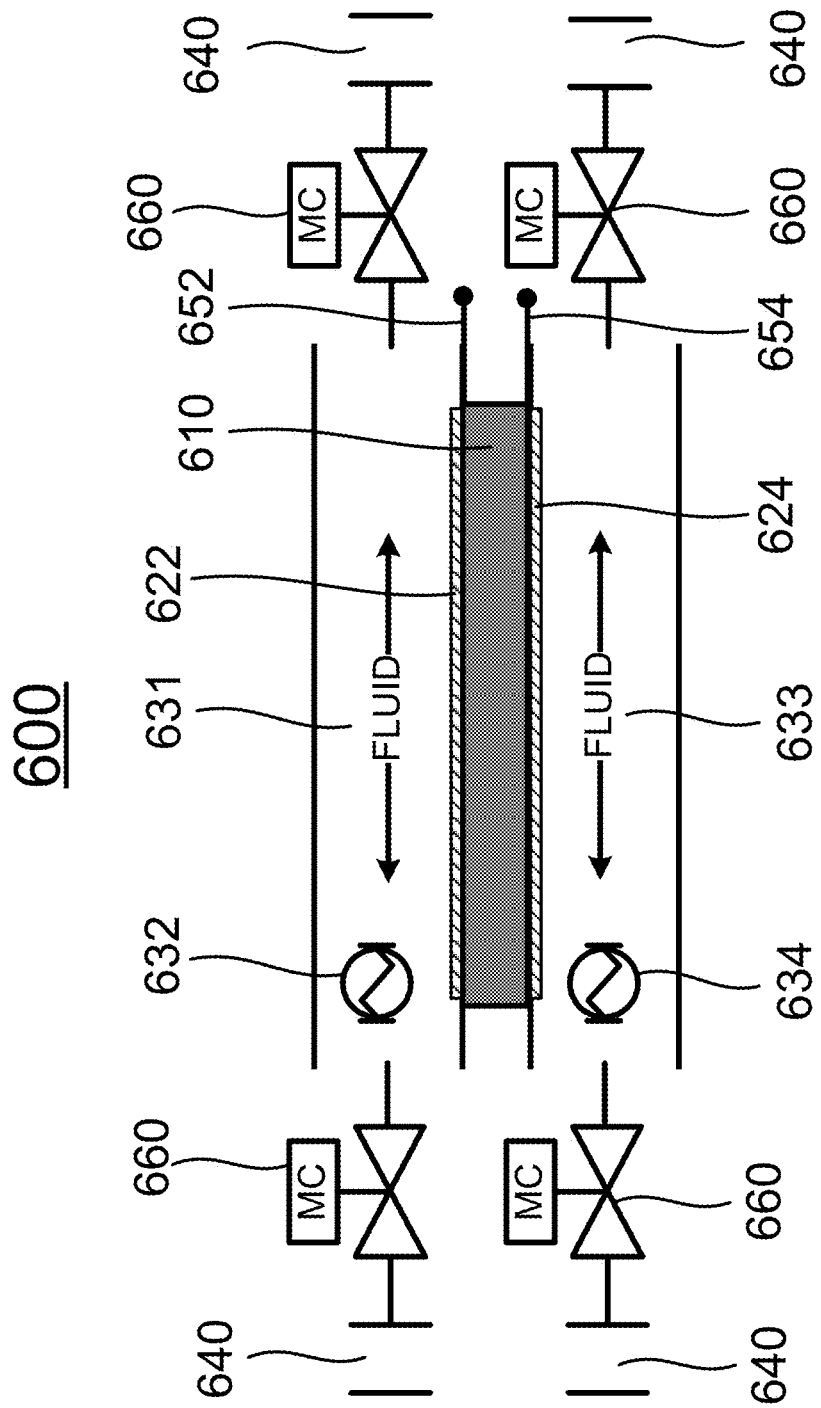
FIG. 4 shows schematically a cross-sectional view of a ferroelectric device for converting heat to electric energy according to one embodiment of the present invention.
Figure 5:
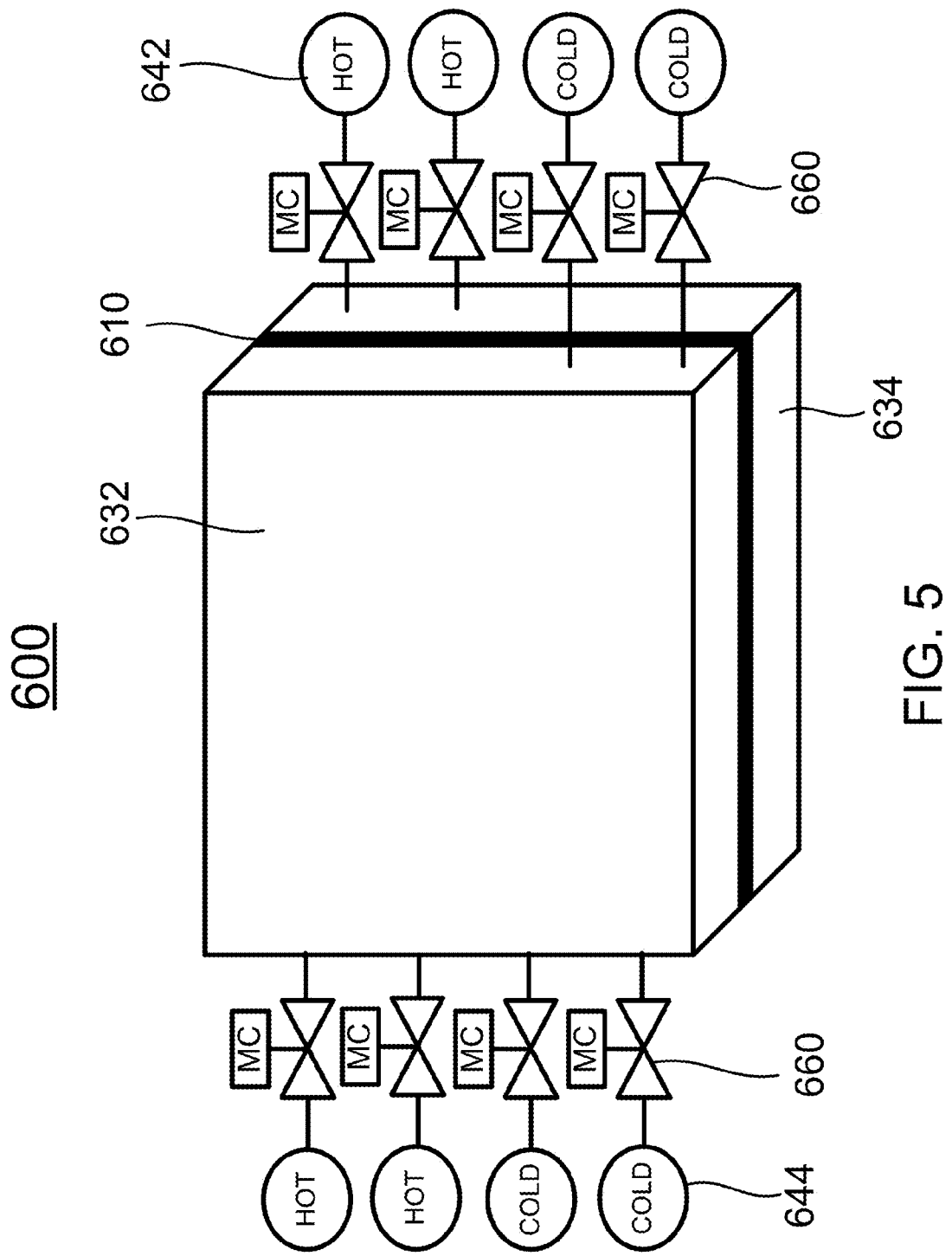
FIG. 5 shows schematically a perspective view of the ferroelectric device as shown in FIG. 4.

FIGS. 4 and 5 show another embodiment of a heat-to-electric conversion device 600 according to the present invention. In the exemplary embodiment, the device 600 has a ferroelectric layer 610, a pair of electrodes 622 and 624 respectively formed on the surfaces of the ferroelectric layer 610, and a delivering means in relation to the pair of electrodes 622 and 624 for alternately delivering a cold fluid and a hot fluid over the surface of the ferroelectric layer so as to alternately cool the ferroelectric layer 610 at a first temperature $T_L < T_c$, and heat the ferroelectric layer 610 at a second temperature $T_H > T_c$; thereby the ferroelectric material of the ferroelectric layer 610 undergoes alternating phase transitions between the ferroelectric phase and the paraelectric or antiferroelectric phase with temperature cycling.

As shown in FIG. 4, the delivering means has a first fluid passage 631 and a second fluid passage 633, a number of heat exchangers 632 and 634 including the first and second fluid passages 631 and 633, and a plurality of control valves 660 in communication with the heat exchangers 632 and 633.

The first fluid passage 631 and the second fluid passage 633 are configured such that when a cold fluid passes through at least one of the first and second fluid passages 631 and 633, the ferroelectric layer 610 is cooled towards the first temperature $T_L$, and when a hot fluid passes through at least one of the first and second fluid passages, the ferroelectric layer is heated towards the second temperature $T_H$. The flow of cold and hot fluids is supplied from a heat sink 644 and a heat source 642, respectively, through, for example, a conduit 640.

The heat exchangers 632 and 634 are adapted for alternately delivering the flow of cold fluid and the hot fluid so as to alternately cool the ferroelectric layer 610 at a first temperature $T_L$, and heat the ferroelectric layer 610 at a second temperature $T_H$. The plurality of control valves 660 is adapted for controlling the flow of cold and hot fluids in order to cycle the ferroelectric modules around their respective transition temperatures. The plurality of control valves 660, controlled by microcontrollers, are connected to thermocouples in the heating and cooling fluids and attached to the ferroelectric, and the temperature and other data such as the capacitance of the ferroelectric may be used to control the opening and closing of the control valves 660. The pressure in the hot and cold fluids may also be monitored at one or more locations, respectively. The cooling and heating of the ferroelectric is coordinated with the opening and closing of the electrical circuit, all under the direction of a control circuit that is subject to computer control, to achieve the cycle described herein. Electrical and thermal cycling are coordinated by directly monitoring, among other things, the temperature of the ferroelectric with devices such as thermocouples or thyristors; the temperature of the heating and cooling fluids; the capacitance of the ferroelectric system, capacitance being correlated to the temperature of the ferroelectric layer as a whole; the polarization of the ferroelectric layer; and/or the pressure of the hot and cold fluids, particularly in two-phase heat exchanger configurations. The extent of unbound charges on the electrodes 622 and 624 may also be monitored and may be used in controlling the cycle and, among other things, determining when the field resulting from that charge remains sufficient to pole the dipoles during the transition of the ferroelectric layer 110 into its ferroelectric phase.

Figure 6:
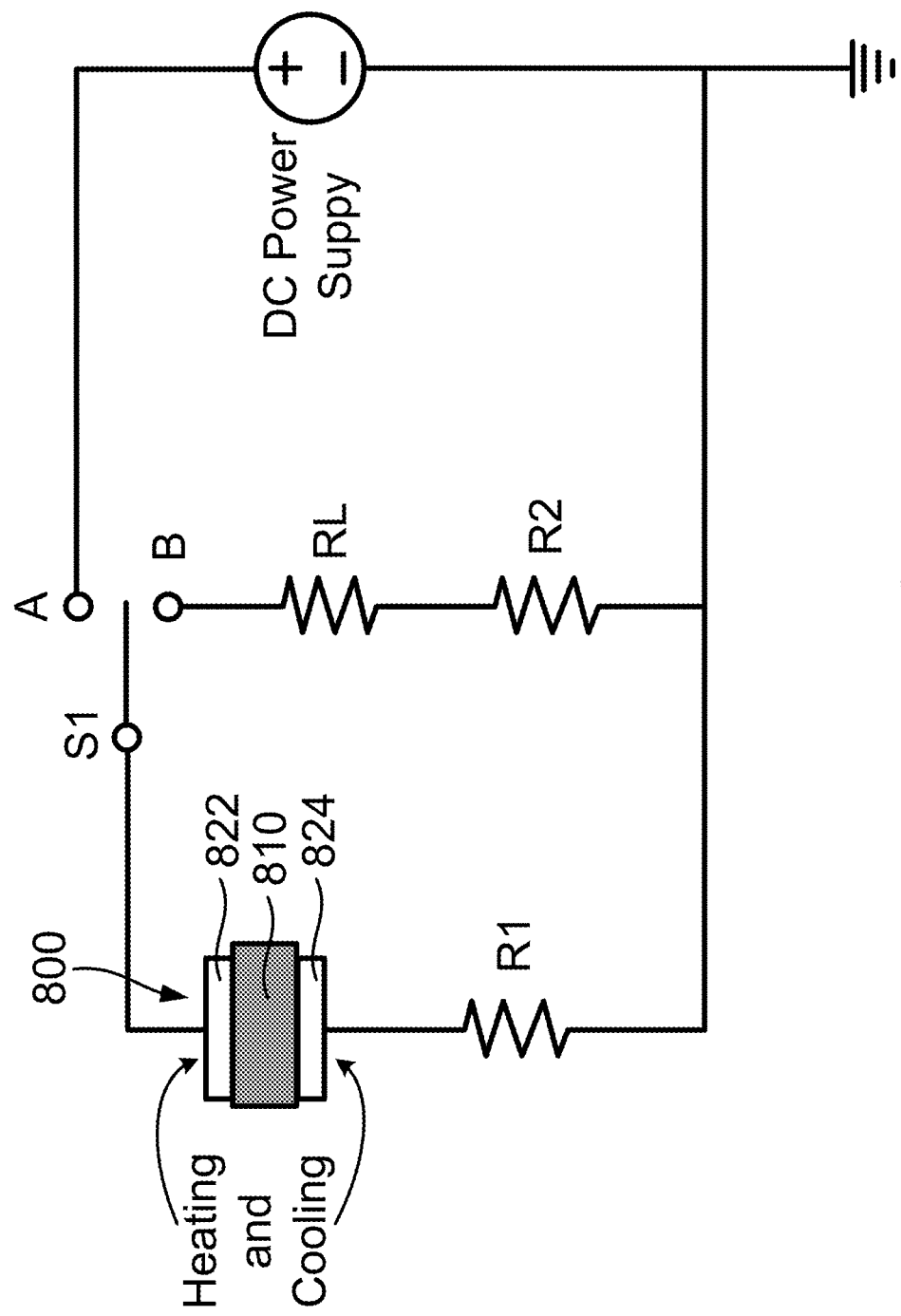
FIG. 6 shows schematically a ferroelectric power generator for operation with a resistive load according to one embodiment of the present invention.

FIG. 6 illustrates schematically a heat-to-electric energy conversion device 800 connected to a DC power supply that may be used for poling if necessary, and to an external load resistance, RL, for receiving the electrical energy generated, according to one embodiment of the present invention. According to one embodiment, one or more monitoring devices (not shown) are attached to or embedded in the ferroelectric device to monitor the temperature of the ferroelectric material. Such monitoring may be done, for example, by one or more thermocouples or thyristors or by monitoring the capacitance of the device. Additionally, resistors R1 and R2 which may remain in the circuit to monitor the current, as they have negligible resistance compared to the load resistance RL. Polarization may be monitored by integrating the current flow through resistors R1 and/or R2. Throughout the cycle, the ferroelectric module 800 undergoes actions controlled by one or more computers acting through a control circuit, which are not shown, that control heating and cooling and control the switch S1 as described herein.

In practice, the cycling of the ferroelectric modules 600 and 800 are repetitive and ongoing so long as the device is to be used to generate electricity from heat. Thus, a description of a cycle could begin at any point in the cycle. For the purpose of illustrating the operation of the device in one embodiment, the ferroelectric module 600 or 800 is initially assumed to be at point C of the cycle depicted in FIG. 20. At that point, switch S1 is opened and the ferroelectric layer 810 is at $T_H$ and polarization is at $P_L$. As described elsewhere the value of $P_L$ may correspond to a residual unbound charge that creates a field sufficient for poling the electric dipoles that arise spontaneously when the ferroelectric layer 810 transitions to the ferroelectric phase. While the switch S1 remains open at the mid-position, the ferroelectric layer 810 is cooled to $T_L$ by the withdrawal of heat, bringing the cycle to point D in FIG. 20. Keeping the switch S1 open prevents the flow of charge to or from the electrodes 822 and 824, such that polarization remains at $P_L$ during the CD step of the cycle.

At point D of the cycle in the usual operation of the invention after the first cycle in those embodiments in which a residual charge is used for poling, switch S1 is switched to position B as shown on FIG. 6, which closes the circuit between the electrodes 822 and 824 and the load resistance, RL. While the switch S1 is in position B, heat is withdrawn from the ferroelectric layer 810 isothermally at $T_L$, corresponding to step DA of the cycle depicted in FIG. 20. In step DA, the polarization retains its direction but increases to the value $P_H$. The resulting overall spontaneous polarization, $P_s$, produces very large bound charges on the surfaces of the ferroelectric layer 810. Those bound charges cause screening charges to develop on electrodes 822 and 824 that are equal and opposite to the bound charges at the surfaces of the ferroelectric layer 810. Heat $Q_L$ withdrawn during the DA step of the cycle corresponds to the enthalpy of phase transition. At point A, spontaneous polarization in the ferroelectric layer 810 is at the maximum, $P_H$, and the net electric field in the electrodes is negligible since the electrodes now carry sufficient charges to balance the bound charges due to $P_H$. Large amounts of electrical energy are generated spontaneously during step DA corresponding, for example, to the free energy difference between points D and A in FIG. 19.

FIG. 3 illustrates (1) the bound charges in the ferroelectric that are the result of the aligned electric dipoles and $P_s$ and (2) the screening charges that arise on the electrodes in opposition to those bound charges, as would occur at point A of the cycle (though at point A the load resistance RL would not be in the circuit as it is depicted in FIG. 3)

In one embodiment, a DC voltage source is included in the circuit when the switch S1 is in position A, and that voltage source can be used for poling in the first cycle or for any reason if during operation the field from the residual charges on the electrodes 822 and 824 at point D of the cycle becomes insufficient to pole the ferroelectric layer 810. In that event, switch S1 is switched to position A at point D of the cycle and a DC voltage is applied across the ferroelectric layer to pole the dipoles that spontaneously arise during transition. The voltage required for poling is material dependent, but is small compared to the voltage at which the charge is discharged from the ferroelectric device 800. Other than the minimum required for poling in such instances, a voltage need not be applied across the ferroelectric layer 810 and is discontinued. When polarization reaches $P_H$, the switch S1 is opened to the mid-position illustrated in FIG. 6, and the device is at point A in the cycle of FIG. 20.

The field that is sufficient for poling depends upon the particular material, its geometry, whether the device is operated in a single- or multi-stage configuration, and other factors. The minimum poling field generally will be of comparable strength whether it is created by the residual charges on electrodes 822 and 824 at points C and D of the cycle, or whether it is imposed from an external DC voltage source. By way of an example, for some single stage, lead-based ceramic ferroelectrics of approximately 1.0 mm thickness, an adequate poling field may be achieved by a voltage of approximately 200 volts. By contrast, the generated voltage for such a material can exceed 6,000 volts during electrical discharge. Without poling, the polarizable material would spontaneously exhibit electric dipoles when the material is in the ferroelectric phase but, in the overall aggregate, the dipoles would not be aligned. Such alignment is essential to achieve the high overall $P_s$ values that are exploited by the invention.

During the AB step of the cycle depicted in FIG. 20, the switch S1 is open, and the ferroelectric layer 810 is heated to $T_H$ so that it transitions out of the ferroelectric phase. Because the switch is open, the unbound charges on the electrodes are prevented from discharging during the lattice heating that occurs during the AB step, and total polarization remains at $P_H$.

At point B of the cycle, switch S1 is switched to position B in FIG. 6, and heat is added to the ferroelectric layer 810 isothermally at $T_H$ so that large amounts of electrical energy are released to the load RL from the ferroelectric module 800. As the electrical charges are removed from the electrodes 822 and 824, the charges are received at a very high voltage by the load resistor, RL, or by any other suitable device that can be used to store, transmit, or utilize electricity for work. When the free charges remaining on the electrodes 822 and 824 have diminished to the minimum that is sufficient to establish a field to pole the spontaneous dipoles during the transition back to the ferroelectric state, in those embodiments in which poling is achieved through an internally generated field, the withdrawal of electrical energy from the electrodes is stopped by opening the switch S1, which corresponds to point C of the cycle. Total polarization at that point is $P_L$, and the ferroelectric layer 810 is at $T_H$.

In one embodiment, a full-wave rectifier (not shown) is included in the circuit when the switch S1 is in position B. The rectifier causes current flows to and from the electrodes 822 and 824 to have the same direction at the load RL whether the current occurs during the BC or DA steps of the cycle. Such a full-wave rectifier may consist, for example, of a bridge circuit. Rectifying the signal in this fashion may simplify the subsequent use or storage of the electrical energy generated during cycling.

In another embodiment, the ferroelectric material is not cycled pursuant to the thermodynamic cycle set forth in FIG. 20 and as otherwise described herein. Rather, the ferroelectric module may be cycled using any thermodynamic cycle that allows the ferroelectric material to be cycled from a ferroelectric state in which the spontaneous dipoles are poled, to a paraelectric or antiferroelectric state wherein polarization is maintained so that it does not decrease below a minimum level, $P_L$, where $P_L$ corresponds to a level of polarization that produces a field sufficient to pole during the transition to the ferroelectric phase. In yet another embodiment, $P_L$ is allowed to become negligible or zero and poling is achieved by application of an applied DC voltage with the switch S1 in FIG. 6 in position A during step DA of the cycle depicted in FIG. 20.

In yet another embodiment, instead of cycling the ferroelectric material through phase transition, it is maintained at all times in a ferroelectric phase, and is cycled from a greater degree of polarization to a lesser degree of polarization.

The thermal cycling and the electrical inputs and outputs are computer controlled throughout the cycle. Heating and cooling during the various steps of the cycle are accomplished by microcontrollers causing hot and cold fluids to be directed alternately to the ferroelectric module 800. Different controls, as may be appropriate to a particular application and to a particular heating and cooling system, can be attained using microcontrollers in combination with computers and a control circuit. The control valves that regulate the flow of heating and cooling fluids to the ferroelectrics in one embodiment are illustrated in FIGS. 4 and 5. The computer controls receive temperature values from thermocouples or other devices that monitor the temperature in the heating and cooling fluids and in the ferroelectric materials. Pressures in the hot and cold fluids may also be monitored. The computer controls also monitor polarization and load currents as measured, for example, by resistors R1 and R2, as shown in FIG. 6. Polarization may be monitored by integrating the current flow through resistors R1 and/or R2. Computers and a control circuit control the heat exchangers to cause appropriate thermal cycling of the ferroelectric module in accordance with the thermodynamic cycle being used. Microcontrollers that receive such monitoring data under computer control also direct the position of the switch S1. Instead of or in addition to thermocouples or thyristors, capacitance or other measurements of one or more control ferroelectrics may be used as monitors and to control the timing of the cycling and switching with the control circuit.

Referring to FIG. 7, a method 900 for operating the invented device for converting heat to electrical energy is shown according to one embodiment of the present invention. In one embodiment, the method 900 includes the following steps: at step 910, a ferroelectric layer is provided. The ferroelectric layer is comprised of a ferroelectric material characterized with a Curie temperature, $T_c$. A pair of electrodes is positioned respectively on the first surface and the second surface of the ferroelectric layer, with electrical leads going from the electrodes to external circuitry. The electrodes are comprised of a thermally and electrically conductive material.

At step 920, a cold fluid and a hot fluid are alternately delivered so as to alternately cool the ferroelectric layer to a first temperature $T_L$ that is lower than the Curie temperature $T_c$, and heat the ferroelectric layer to a second temperature $T_H$ that is higher than the Curie temperature $T_c$. During step 920, the electrical circuit is opened so that cooling and heating occur under effectively constant polarization, $P_L$ and $P_H$, respectively, while lattice cooling and heating occur. The cold fluid and the hot fluid can alternately be delivered by heat exchangers, control valves, or the likes, controlled in coordination with data monitors and under direction from a control circuit.

At step 930, a cold fluid and a hot fluid are alternately delivered so as to alternately remove heat from the ferroelectric layer isothermally at a first temperature $T_L$ that is lower than the Curie temperature $T_c$, and add heat to the ferroelectric layer isothermally at a second temperature $T_H$ that is higher than the Curie temperature $T_c$. During step 930, the electrical circuit is closed so that the removal of heat occurs as polarization changes from $P_L$ to $P_H$, and the addition of heat occurs as polarization changes from $P_H$ to $P_L$. A cold fluid and a hot fluid can alternately be delivered by heat exchangers, control valves, or the likes, controlled in coordination with data monitors and under direction from a control circuit.

At step 940, with the ferroelectric material initially in a metastable state, the spontaneous polarization of the domains in the ferroelectric material is poled at temperature $T_L$ so as to generate electrically-opposite screening charges on the pair of electrodes. In one embodiment, poling is performed by applying a small DC voltage to the ferroelectric layer to create a poling field that aligns the dipoles.

At step 950, heat is added to the ferroelectric material isothermally at $T_H$, and the circuit is closed. Electric energy corresponding to the generated electrically-opposite screening charges on the pair of electrodes is output to an external circuitry at a very high voltage. In one embodiment, the circuit is opened to allow a sufficient residual charge remaining on the electrodes to provide a field for poling during the next cycle.

It should be noted that, while the essential function of the device occurs in a single layer with a given ferroelectric material, the invention may be more useful and may produce greater quantities of electrical energy where a number of ferroelectric materials are combined in a series of stages.

The maximum efficiency of any system that converts thermal energy to another form of energy, or to work, is the Carnot efficiency, $\eta_c = \Delta T/T_H$. A single stage ferroelectric power conversion module includes a single ferroelectric material. As such, it generally has a single phase transition temperature reflecting the transition between the ferroelectric phase and the paraelectric or the antiferroelectric phase. The temperature differential between the heat source and heat sink ($\Delta T = T_H - T_L$) in condenser implementations may be relatively small. At thermal power plants, for example, the difference in circ water temperatures entering and leaving the condenser commonly may be ~10° C., and the difference in temperature between the low pressure steam entering the condenser and the cooling circ water entering the condenser may be ~20° C. It may be desirable, however, to use a series of more than one ferroelectric material that has a succession of phase transition temperatures that incrementally cover the available range of temperatures. The desirability of using multiple ferroelectrics will depend on various factors, including for example the sharpness of the phase transition—i.e., the magnitude of the temperature range across which most or all of the phase transition occurs.

Multiple ferroelectrics can be used with either of the two basic ways in which the invention couples the ferroelectric generator to condenser heat—i.e. (1) by using heated effluent from the condenser as a heat source, or (2) by constructing the condenser so that the ferroelectric is in direct thermal contact with the condensing vapor. In the former implementation, a multi-stage apparatus FIG. 8 shows one embodiment where an apparatus 1000 has a plurality of ferroelectric modules, FM1, FM2, . . . FMn-1 and FMn, arranged in an array to expand the working surface that interfaces with the heat exchangers so as to increase the amount of thermal energy that can be received from the heat source and be converted to electrical energy. The electrical output is removed by buses 1001 connected to the electrodes of each module.

Figure 9:
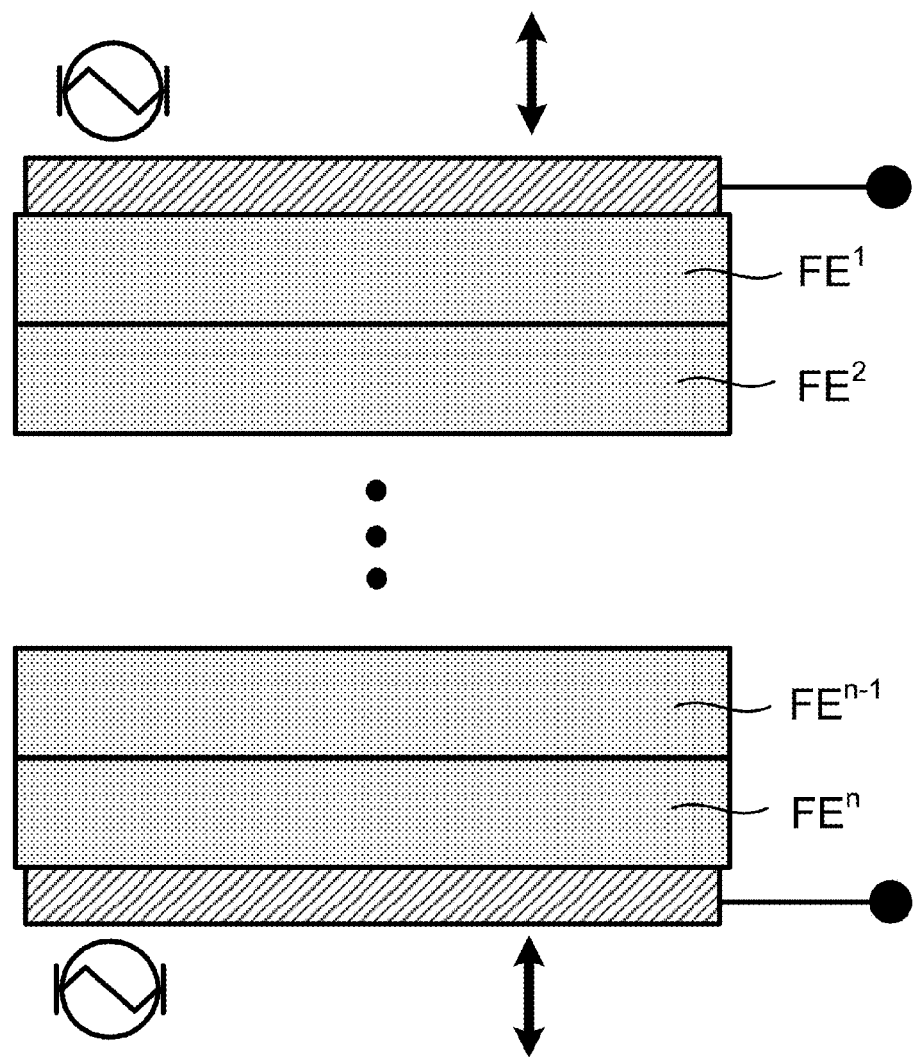
FIG. 9 shows schematically a ferroelectric device for converting heat to electric energy according to another embodiment of the present invention.
Figure 10:
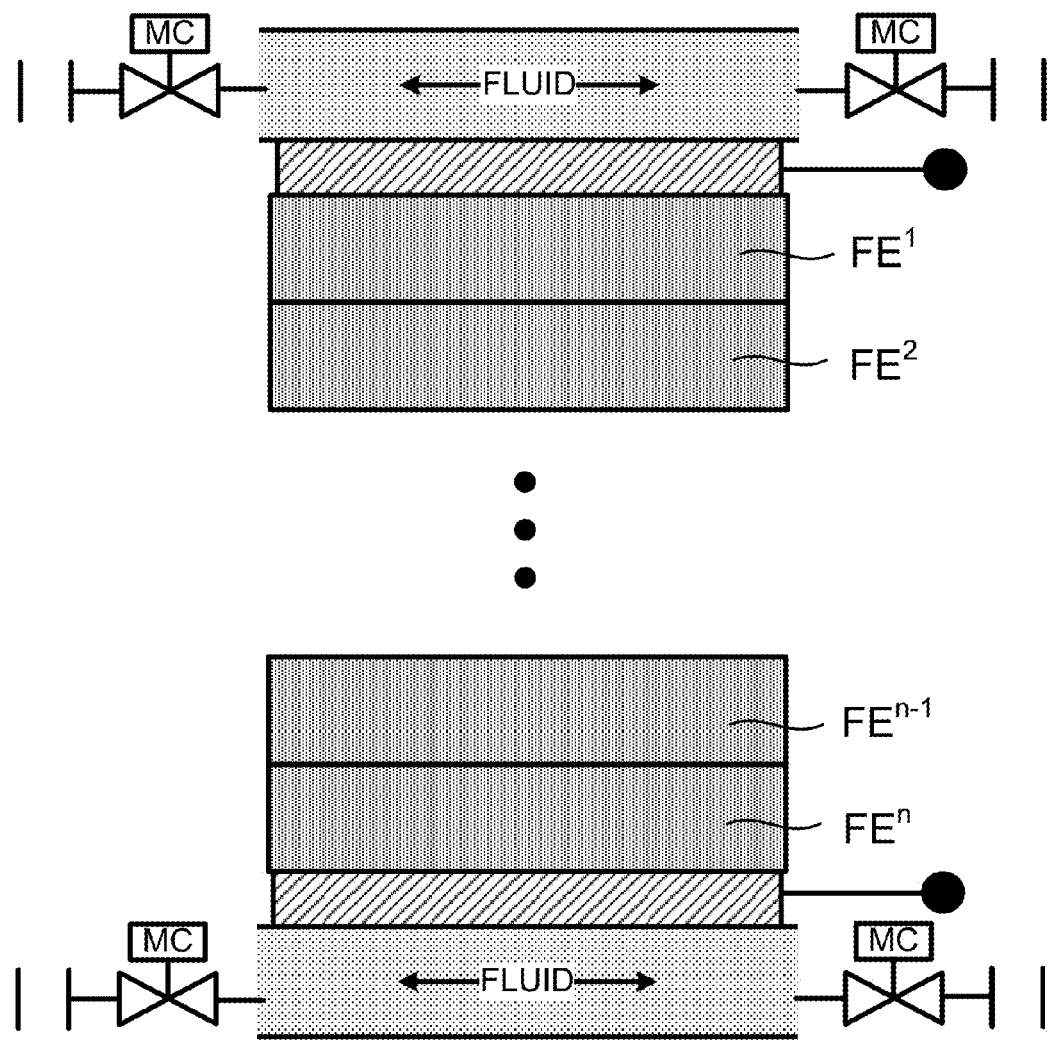
FIG. 10 shows schematically a ferroelectric device for converting heat to electric energy according to yet another embodiment of the present invention.

In a multilayer configuration, a series of ferroelectric layers may be arranged in a stack formed in order to maximize thermal conductivity. The resulting multilayered ferroelectric structure is placed between a pair of electrodes, which is similar to the single layer device as disclosed above. Such a configuration is illustrated diagrammatically by FIGS. 9 and 10. The sequential layers, $FE^1$, $FE^2$ . . . $FE^{n-1}$ and $FE^n$, are formed of an identical ferroelectric material or substantially different ferroelectric materials. The Curie temperatures, $T_c^1$, $T_c^2$ . . . $T_c^{n-1}$ and $T_c^n$, correspond to the ferroelectric materials in the sequential layers $FE^1$, $FE^2$ . . . $FE^{n-1}$ and $FE^n$. In one embodiment, the multilayered ferroelectric materials are arrayed so that $T_c^{i+1} > T_c^i$. In one embodiment, the combined multilayer module is then cycled thermally and electrically so that each individual layer cycles around its phase transition temperature in a cycle that has two isothermal steps and two steps where total polarization in the layer is maintained constant. Each layer, during the course of a cycle, undergoes ferroelectric-paraelectric or ferroelectric-antiferroelectric cycling with poling and discharge as described herein for a single layer device. With this multilayer configuration, as shown in FIGS. 9 and 10, the electrical energy removed at high voltage during the discharge step of the cycle is related to the total spontaneous polarization, $P_s$, at the junctures of the electrodes and the ferroelectric materials designated as $FE^1$ and $FE^n$, which polarization results from the cumulative spontaneous polarization of each FE layer acting together.

Figure 11:
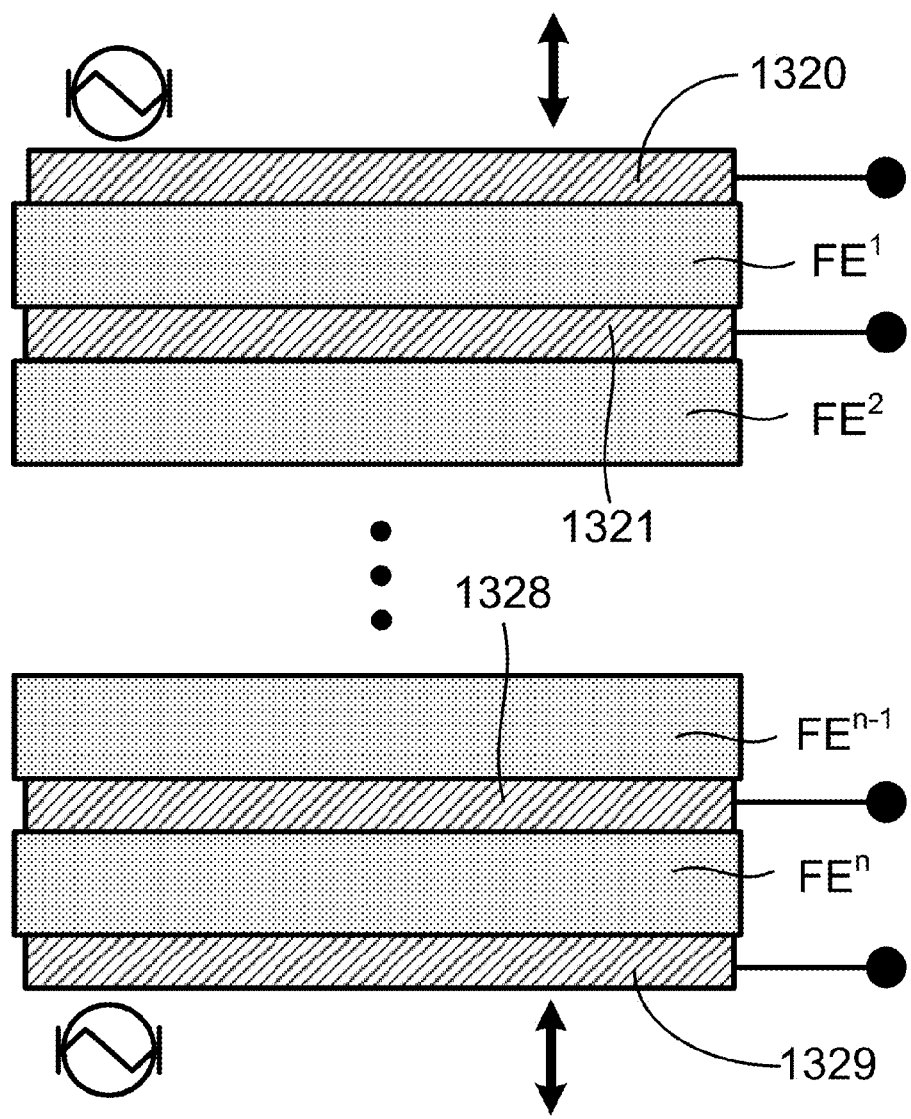
FIG. 11 shows schematically a ferroelectric device for converting heat to electric energy according to an alternative embodiment of the present invention.

Referring to FIG. 11, another embodiment of a multilayered ferroelectric device 1300 is shown according to the present invention. This configuration of the multilayered ferroelectric device 1300 is similar to the device as disclosed in FIG. 9, but separate electrodes are placed between each ferroelectric layer. For example, the ferroelectric layers $FE^1$ and $FE^2$ are separated by the electrode 1321, while the ferroelectric layers $FE^{n-1}$ and $FE^n$ are separated by the electrode 1328. These electrodes 1320, 1321 . . . 1328 and 1329 are formed of a thermally and electrically conductive material. The thermal and electrical cycling and operation of the device 1300 are similar to the device as disclosed in FIGS. 9 and 10. However, the extraction of the electrical energy from the device is different. In this configuration, the electrical energy is withdrawn during the discharge step of the cycle from all of the electrodes 1320, 1321 . . . 1328 and 1329, as shown in FIG. 11. The electrical energy withdrawn from the electrodes 1320, 1321 . . . 1328 and 1329 can then either be transported via the connective leads to a load resistance or to a bus for exportation to such external circuitry and use as may be desired.

Figure 12:
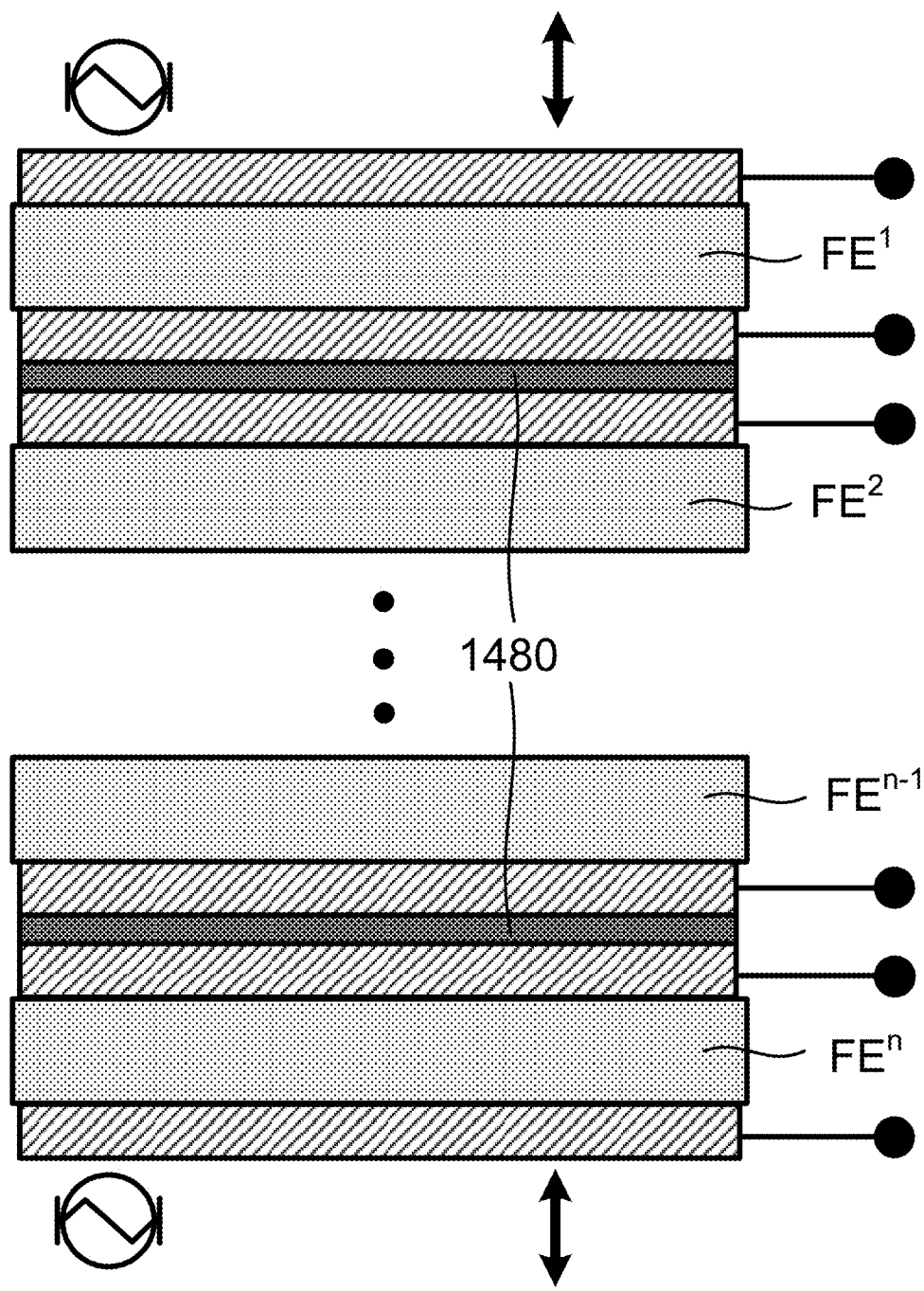
FIG. 12 shows schematically a ferroelectric device for converting heat to electric energy according to a further embodiment of the present invention.

FIG. 12 shows schematically an alternative embodiment of a multilayered ferroelectric device 1400. This configuration of the multilayered ferroelectric device 1400 is similar to the device as disclosed in FIG. 11, but each ferroelectric layer is separated from the adjacent layer of ferroelectric material by two electrodes which, in turn, are separated by an electrical insulator 1480, selected to minimally impede thermal transfer.

Figure 13:
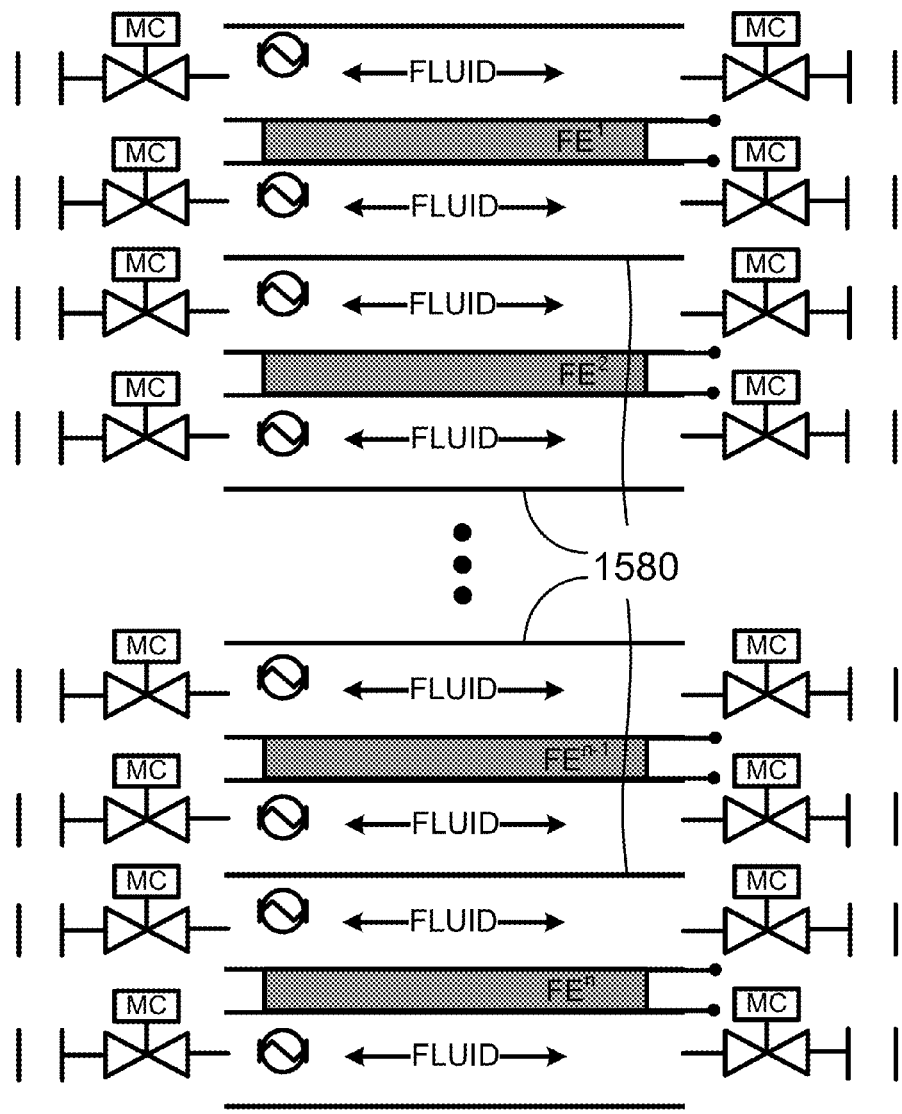
FIG. 13 shows schematically a ferroelectric device for converting heat to electric energy according to yet a further embodiment of the present invention.

FIG. 13 illustrates schematically a system of n individual ferroelectric modules with a series of different phase transition temperatures, $T_c^1$ to $T_c^n$, that lie in an increasing (or decreasing) sequence between the temperatures of the heat source, $T_H$, and the heat sink, $T_L$, and that are operated with a heat exchanger system so as to cycle each ferroelectric stage, $FE^i$, around its respective phase transition temperature, $T_c^i$. In this configuration, the phase transition temperatures vary among different ferroelectric layers $FE^1$, $FE^2$ . . . $FE^{n-1}$ and $FE^n$. As shown in FIG. 13, a series of single-layer devices as shown in FIG. 4 are arranged in a stack. Each single-layer device operates with heat exchangers that selectively heat and cool the individual ferroelectric modules so that the i-th layer is thermally cycled around its respective phase transition temperature, $T_c^i$. In this configuration, the ferroelectric modules are integrated with a networked heat exchanger that cycles each ferroelectric module, FM', around its transition temperature, $T_c^i$. The heat exchangers may be interconnected to facilitate regenerative heating and cooling or to facilitate operating the ferroelectric modules in cascade with decreasing temperature. Adjacent heat exchangers may be thermally insulated from one another by thermal insulators 1580, as shown in FIG. 13. In this system, thermocouples are located such that the temperature of the heating and cooling fluids is monitored throughout the system, as are the temperatures or capacitance of the ferroelectrics in the individual modules. A system of microcontrollers acting in a control circuit then directs the heating and cooling fluids at appropriate temperatures to cause each ferroelectric stage, $FE^i$, to cycle around its respective phase transition temperature, $T_c^i$, in the format and method of poling and thermal and electrical cycling described herein for a single-stage device. In one embodiment, each cycle of the various ferroelectric stages, $FE^i$, undergoes coordinated thermal and electrical cycling as described herein for a single stage with two isothermal steps and two steps where total polarization in the layer is maintained constant. The electrical energy withdrawn from the electrodes can either be transported via the connective leads to a load resistance or to a bus for exportation to such external circuitry and use as may be desired.

The multi-stage construction of the ferroelectric layers as described can also be used where the ferroelectric is integrated into the condenser, as for example where the ferroelectric is affixed to condenser tubes so that it is heated by direct thermal contact with the vapor as it is condensed. In one such embodiment, the multi-layer ferroelectric is affixed directly to the exterior surface of the conducting tubes in a shell and tube surface condenser with the layer having the lowest transition temperature being adjacent to the casing. The casing of the tube serves as a grounded electrode. One or more other electrodes are part of the multi-layer ferroelectric as described above. The condenser chamber is otherwise configured as described for the one-stage embodiment such that the vapor being condensed provides the source of heat at $T_H$ to the multi-stage ferroelectrics without an intermediate heat exchanger. In one embodiment, the condensation falls into the hot well as with an ordinary condenser and is removed from there. The ferroelectrics are cooled by the circulation of the cooling water or other fluid at $T_L$ in the condenser tubes. The multi-stage ferroelectric material is thus thermally and electrically cycled as described herein in various examples under the direction of a control circuit.

The foregoing descriptions of exemplary embodiments of the invention are presented only for purposes of illustration and description and are not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An apparatus for converting heat to electric energy comprising:
   (a) a ferroelectric generator comprising:
      a first electrode formed of a thermally and electrically conductive material;
      a second electrode formed of a thermally and electrically conductive material, wherein the second electrode is spaced from the first electrode; and
      one or more layers of an electrically polarizable material between the first and second electrodes, wherein the electrically polarizable material is characterized with a phase transition temperature at which the material transitions between a first phase in which the electrically polarizable material exhibits spontaneous polarization and a second phase in which the electrically polarizable material does not exhibit spontaneous polarization;
   (b) a first heat exchanger coupling with the ferroelectric generator for adding thermal energy to the one or more layers of electrically polarizable material, wherein the first heat exchanger is in thermal communication with a heat source, wherein the heat source comprises a condenser;
   (c) a second heat exchanger coupling with the ferroelectric generator for withdrawing thermal energy from the one or more layers of electrically polarizable material, wherein the second heat exchanger is in thermal communication with a heat sink; and
   (d) a control circuit for thermally cycling the one or more layers of electrically polarizable material between a first temperature $T_1$ and a second temperature $T_2$ by alternately adding thermal energy to and withdrawing thermal energy from the one or more layers of electrically polarizable material using the first and second heat exchangers, respectively, so that the electrically polarizable material thereby undergoes alternating phase transitions between the first phase and the second phase with temperature cycling, wherein the electrically polarizable material exhibits spontaneous polarization at $T_1$ and wherein the spontaneous polarization exhibited by the electrically polarizable material at $T_2$ is less than the spontaneous polarization exhibited by the electrically polarizable material at $T_1$,
   wherein a DC poling voltage is applied to the one or more layers of electrically polarizable material such that, when the electrically polarizable material is in a first portion of the cycle which includes the temperature $T_1$, the electrically polarizable material develops an overall net spontaneous polarization and screening charges are generated on the first and second electrodes;
   wherein the first and second electrodes are connected to a load such that the generated screening charges are discharged as electrical energy output from the first and second electrodes to the load when the electrically polarizable material undergoes a transition from the first phase to the second phase in a second portion of the cycle which includes the temperature $T_2$;
   wherein adding the thermal energy to the one or more layers of electrically polarizable material comprises extracting the thermal energy from the condenser and transferring the thermal energy to the one or more layers of electrically polarizable material; and
   wherein residual charges are left on the first and second electrodes after electrical energy is output to the load and wherein the residual charges provide the DC poling voltage for the next cycle.

2. The apparatus of claim 1, further comprising a hydrophilic material on a surface of the second electrode opposite the one or more layers of electrically polarizable material.

3. The apparatus of claim 1, further comprising electrical insulation on the edges of the first and second electrodes.

4. The apparatus of claim 2, further comprising a hydrophilic material on the edges of the second electrode and/or on the edges of the one or more layers of electrically polarizable material.

5. The apparatus of claim 1, wherein the electrically polarizable material is an electrically polarizable amorphous polymer material.

6. The apparatus of claim 1, wherein each of the one or more layers of electrically polarizable material comprises a ferroelectric material having a Curie temperature, $T_c$, such that when the temperature of the ferroelectric material is lower than the Curie temperature, $T_c$, the ferroelectric material is in a ferroelectric phase and when the temperature of the ferroelectric material is greater than the Curie temperature, $T_c$, the ferroelectric material is in a paraelectric or anti-ferroelectric phase.

7. The apparatus of claim 1, further comprising:
- a temperature measuring device for monitoring the temperature of the one or more layers of electrically polarizable material;
- a capacitance measuring device for monitoring the capacitance of the one or more layers of electrically polarizable material;
- a polarization measuring device for monitoring the polarization of the one or more layers of electrically polarizable material; and/or
- a current measuring device for monitoring the current to and/or from the electrodes.

8. The apparatus of claim 1, wherein the one or more layers of electrically polarizable material comprise a plurality of layers of electrically polarizable material arranged in a stack between the first and second electrodes.

9. The apparatus of claim 1, wherein withdrawing the thermal energy from the one or more layers of electrically polarizable material comprises removing the thermal energy from the one or more layers of electrically polarizable material and transferring the thermal energy to the heat sink.

\* \* \* \* \*

UNITED STATES PATENT AND TRADEMARK OFFICE
CERTIFICATE OF CORRECTION

PATENT NO.         : 9,780,278 B2
APPLICATION NO.    : 14/572903
DATED              : October 3, 2017
INVENTOR(S)        : Ahmet Erbil et al.

Page 1 of 1

It is certified that error appears in the above-identified patent and that said Letters Patent is hereby corrected as shown below:

On the Title Page

Item (73):
"The NEOTHERMAL ENGERGY COMPANY"
Should read as follows:
--THE NEOTHERMAL ENERGY COMPANY--.

Signed and Sealed this
Twelfth Day of June, 2018

Andrei Iancu
*Director of the United States Patent and Trademark Office*